US012738756B2

(12) United States Patent
Kamijoh et al.

(10) Patent No.: US 12,738,756 B2
(45) Date of Patent: Sep. 15, 2026

(54) ELECTRIC POWERED WORKING MACHINE

(71) Applicant: Hitachi Construction Machinery Co., Ltd., Tokyo (JP)

(72) Inventors: Takashi Kamijoh, Tokyo (JP); Ken Takeuchi, Ibaraki (JP); Itaru Naya, Ibaraki (JP); Kenta Tanigaki, Ibaraki (JP); Takeshi Inoue, Tokyo (JP)

(73) Assignee: Hitachi Construction Machinery Co., Ltd., Tokyo (JP)

( * ) Notice: Subject to any disclaimer, the term of this patent is extended or adjusted under 35 U.S.C. 154(b) by 750 days.

(21) Appl. No.: 18/018,106

(22) PCT Filed: Jul. 26, 2021

(86) PCT No.: PCT/JP2021/027544
§ 371 (c)(1),
(2) Date: Jan. 26, 2023

(87) PCT Pub. No.: WO2022/024994
PCT Pub. Date: Feb. 3, 2022

(65) Prior Publication Data
US 2023/0291221 A1 Sep. 14, 2023

(30) Foreign Application Priority Data
Jul. 29, 2020 (JP) ................................ 2020-128003

(51) Int. Cl.
*H02J 7/92* (2026.01)
*B60L 58/12* (2019.01)
(Continued)

(52) U.S. Cl.
CPC ................ *H02J 7/92* (2026.01); *B60L 58/12* (2019.02); *B60L 58/16* (2019.02);
(Continued)

(58) Field of Classification Search
CPC ........ H02J 7/92; H02J 7/82; H02J 7/84; H02J 700/84; H02J 7/933; H02J 7/977;
(Continued)

(56) References Cited

U.S. PATENT DOCUMENTS 5,410,238 A * 4/1995 Ishizuka ........... H02J 7/007194 320/160
5,727,372 A * 3/1998 Kanitz .................. A01D 34/78 56/11.9
(Continued)

FOREIGN PATENT DOCUMENTS

JP 10-262305 A 9/1998
JP 2013-70534 A 4/2013
JP 2020-61824 A 4/2020

OTHER PUBLICATIONS

EPO-English-translation of JP-2013070534-A (Year: 2013).*
(Continued)

*Primary Examiner* — John T Trischler
(74) *Attorney, Agent, or Firm* — Crowell & Moring LLP

(57) ABSTRACT

A battery excavator 1 as an electric powered working machine includes a secondary battery 201, a battery management unit 202 that manages the secondary battery 201, and a controller 300 that controls a normal charge or a diagnostic charge for the secondary battery 201. The controller 300 includes: a diagnostic charge recommendation determination unit 301 that determines whether to recommend the diagnostic charge or not based on an operation history of the secondary battery output from the battery management unit 202; and a diagnostic charge execution determination unit 302 that determines whether to execute the diagnostic charge or not based on a state of the secondary battery output from the battery management unit 202, an estimated charge period necessary for the diagnostic charge,
(Continued)

| Temperature (°C) ＼SOC(%) | 90 | 80 | • • • | 10 |
|---|---|---|---|---|
| 60 | 35 Minutes | 30 Minutes | • • • | |
| 50 | 40 Minutes | • • • | | |
| ⋮ | ⋮ | | | |
| | | | | |

and a site work plan including a work start time, when the diagnostic charge is determined to be recommended.

10 Claims, 15 Drawing Sheets

(51) Int. Cl.

| | |
|---|---|
| ***B60L 58/16*** | (2019.01) |
| ***H01M 10/48*** | (2006.01) |
| ***H02J 7/82*** | (2026.01) |
| ***H02J 7/84*** | (2026.01) |
| ***H02J 7/90*** | (2026.01) |
| *G01R 31/367* | (2019.01) |
| *H01M 10/42* | (2006.01) |

(52) U.S. Cl.
CPC ............. *H01M 10/488* (2013.01); *H02J 7/82* (2026.01); *H02J 7/84* (2026.01); *H02J 7/933* (2026.01); *H02J 7/977* (2026.01); *B60L 2200/40* (2013.01); *B60L 2240/545* (2013.01); *B60L 2240/80* (2013.01); *G01R 31/367* (2019.01); *H01M 2010/4271* (2013.01); *H01M 2220/20* (2013.01)

(58) Field of Classification Search
CPC ........ H02J 7/0071; H02J 7/0048; H02J 7/005; H02J 7/00712; H02J 7/007194; H01M 10/488; B60L 58/12
USPC .......................................................... 320/137
See application file for complete search history.

(56) References Cited

U.S. PATENT DOCUMENTS 6,127,805 A * 10/2000 Kikuchi ............. G01R 31/3648 320/132
7,649,343 B2 * 1/2010 Kamatani ............. H01M 10/48 320/160
7,679,335 B1 * 3/2010 Collins ................. H02J 7/0013 320/155
7,859,224 B2 * 12/2010 Baer ....................... H02J 7/342 320/135
7,977,922 B1 * 7/2011 Collins ................ H02J 7/00711 320/140
8,269,467 B2 * 9/2012 Li ..................... H02J 7/007194 320/160
8,823,325 B2 * 9/2014 Ling .................. G01R 31/3835 320/132
8,854,006 B2 * 10/2014 Fukatsu ................ H02J 7/0042 320/133
8,963,504 B2 * 2/2015 Kuroda ..................... H02J 7/04 320/159
9,598,838 B2 * 3/2017 Kaneko ................... B60L 50/15
9,735,593 B2 * 8/2017 Honda .................. H02J 7/0049
9,735,596 B2 * 8/2017 Luo ..................... H02J 7/00718
9,745,723 B2 * 8/2017 Inoue .................... H01M 10/42
9,751,421 B2 * 9/2017 Kinomura ............... B60L 58/12
9,853,471 B2 * 12/2017 Keates ...................... H02J 7/00
10,122,201 B2 * 11/2018 Zhang ................ H02J 7/00712
10,277,053 B2 * 4/2019 Zhang ....................... H02J 7/06
10,340,717 B2 * 7/2019 Zhang ................ H02J 7/00712
10,340,718 B2 * 7/2019 Zhang .................. H02J 7/0044
10,450,723 B2 * 10/2019 Osaka .................. E02F 9/2075
10,461,545 B2 * 10/2019 Inoue .................... H02J 7/0068
10,622,829 B2 * 4/2020 Zhang ....................... H02J 7/02
10,680,460 B2 * 6/2020 Zhang .................. H02J 7/0042
10,723,238 B2 * 7/2020 Hortop .................. H02J 7/0071
10,820,398 B2 * 10/2020 Kim .................. H02J 7/007184
11,056,903 B2 * 7/2021 Lim .................... H02J 7/00036
11,070,076 B2 * 7/2021 Zhang ............... H02M 3/33507
11,085,172 B2 * 8/2021 Sugiyama ............... B60L 1/003
11,108,249 B2 * 8/2021 King ....................... B60L 53/14
11,251,641 B2 * 2/2022 Ha ........................ H02J 7/0048
11,264,652 B2 * 3/2022 Austin .................. H01M 10/44
11,413,985 B2 * 8/2022 Tsurutani ................ B60L 53/62
11,567,139 B2 * 1/2023 Sakai .................... H01M 10/44
11,588,191 B2 * 2/2023 Austin .................. B60L 53/126
11,600,867 B2 * 3/2023 Austin .................. H01M 10/44
11,679,689 B2 * 6/2023 Chadha ................... B60L 53/62 701/22
11,682,908 B2 * 6/2023 Keates .................. H02J 7/0071 320/130
12,355,293 B2 * 7/2025 Zhang ................... H02J 7/0069
12,444,972 B2 * 10/2025 Cha ....................... H02J 7/0068
2006/0267552 A1 * 11/2006 Baer ....................... H02J 7/342 320/128
2009/0189572 A1 * 7/2009 Kamatani ........... H02J 7/00714 320/163
2009/0326749 A1 * 12/2009 Uchida ................... B60L 50/61 320/109
2010/0283431 A1 * 11/2010 Kano ...................... G06F 1/203 361/679.48
2011/0133701 A1 * 6/2011 Li ............................ H02J 7/04 320/160
2012/0049796 A1 * 3/2012 Fukatsu ................ H02J 7/0042 320/109
2012/0101755 A1 * 4/2012 Hirasawa ................ B60L 53/11 702/63
2012/0126744 A1 * 5/2012 Kuroda ................. H02J 7/0071 320/162
2012/0133331 A1 * 5/2012 Ling ................... G01R 31/367 320/132
2014/0217956 A1 * 8/2014 Kinomura ............... B60L 58/12 320/109
2015/0267380 A1 * 9/2015 Kaneko ................... B60L 50/40 180/65.265
2015/0295432 A1 * 10/2015 Honda .................. H02J 7/0014 320/126
2015/0318726 A1 * 11/2015 Luo ....................... H02J 7/0013 320/134
2016/0083932 A1 * 3/2016 Inoue .................... E02F 9/2091 701/22
2016/0149428 A1 * 5/2016 Nunami ................ H02J 7/0047 320/136
2016/0172886 A1 * 6/2016 Keates .................. H02J 7/0071 320/130
2017/0141589 A1 * 5/2017 Inoue .................... H02J 7/0068
2017/0288418 A1 * 10/2017 Alexander .......... H02J 7/00032
2018/0019611 A1 * 1/2018 Zhang ....................... H02J 7/06
2018/0034309 A1 * 2/2018 Zhang .................. H02J 7/0044
2018/0034310 A1 * 2/2018 Zhang .................. H02M 3/156
2018/0034311 A1 * 2/2018 Zhang .................. H02J 7/1492
2018/0062413 A1 * 3/2018 Zhang ....................... H02J 7/02
2018/0069414 A1 * 3/2018 Zhang ..................... H02M 1/08
2018/0248396 A1 * 8/2018 Keates ...................... H02J 7/00
2018/0320338 A1 * 11/2018 Osaka ............... H01M 10/6563
2018/0331561 A1 * 11/2018 Zhang .................. H01F 27/425
2018/0331562 A1 * 11/2018 Zhang ....................... H02J 7/02
2019/0039467 A1 * 2/2019 Hortop .................. H02J 7/0071
2019/0053363 A1 * 2/2019 Kim ........................ H05G 1/54
2019/0067961 A1 * 2/2019 King ..................... H02J 7/0045
2019/0131817 A1 * 5/2019 Ha ...................... H02J 7/00712
2019/0148788 A1 * 5/2019 Austin .................. H01M 10/44 320/109
2019/0229547 A1 * 7/2019 Lim ...................... H01M 10/44
2020/0101865 A1 4/2020 Tsurutani
2020/0108730 A1 4/2020 Tsurutani et al.
2020/0114775 A1 * 4/2020 Tsurutani .......... H02J 7/007188
2020/0199848 A1 * 6/2020 Sugiyama ............... B60L 1/003
2021/0278472 A1 * 9/2021 Sakai ............... H01M 10/0562
2021/0404146 A1 * 12/2021 Ishida ..................... E02F 9/207
2022/0001763 A1 * 1/2022 Chadha ................... B60L 53/66
2022/0190619 A1 * 6/2022 Fasching ............. H01M 10/443
2022/0216531 A1 * 7/2022 Austin .................... B60L 53/38
2022/0216532 A1 * 7/2022 Austin .................. H01M 10/44
2022/0407344 A1 * 12/2022 Cha ...................... H01M 10/44
2022/0412054 A1 * 12/2022 Takeo ..................... E02F 9/261
2023/0044545 A1 * 2/2023 Zhang .................. H02J 7/0048
2023/0318346 A1 * 10/2023 Fasching ............ G01R 31/3835

(56) References Cited

U.S. PATENT DOCUMENTS

2023/0336007 A1* 10/2023 Khoshkbar-Sadigh ...................... B60L 58/21
2024/0078002 A1* 3/2024 Chao ..................... H02J 7/0049
2024/0222989 A1* 7/2024 Hagiwara ................. H02J 7/04
2025/0180649 A1* 6/2025 Kamijio ............ H01M 10/4285

OTHER PUBLICATIONS

International Search Report (PCT/ISA/210) issued in PCT Application No. PCT/JP2021/027544 dated Oct. 12, 2021 with English translation (five (5) pages).
Japanese-language Written Opinion (PCT/ISA/237) issued in PCT Application No. PCT/JP2021/027544 dated Oct. 12, 2021 (three (3) pages).
Extended European Search Report issued in European Application No. 21850048.6 dated Jul. 24, 2024 (9 pages).

* cited by examiner 202
604
SOHQ Calculation Unit
SOHQ
603
Battery Capacity Calculation Unit
$Q_1$
$Q_0$
601
Charge Amount Calculation Unit
ΔQ
602
ΔSOC Calculation Unit
ΔSOC
Current Value I

Fig. 7

| OCV(V) | SOC(%) |
|---|---|
| 3.0 | 0 |
| 3.1 | 10 |
| 3.2 | 20 |
| ⋮ | ⋮ |
| 4.1 | 100 |

Fig. 8

| Temperature (°C) ＼SOC(%) | 90 | 80 | ··· | 10 |
|---|---|---|---|---|
| 60 | 35 Minutes | 30 Minutes | ··· | |
| 50 | 40 Minutes | ⋱ | | |
| ⋮ | ⋮ | | | |
| | | | | |

ELECTRIC POWERED WORKING MACHINE

TECHNICAL FIELD

The present invention relates to an electric powered working machine including a secondary battery. This application claims priority to Japanese Patent Application No. 2020-128003 filed on Jul. 29, 2020, and its contents are incorporated herein.

BACKGROUND ART

Recently, an effort of electrifying a power source mounted on a working machine such as a construction machine has been made. The electrification of power source is achieved by using an electric storage device that stores electric power as a power source and driving an electric motor mounted on a working machine by the electric power supplied from the electric storage device. While examples of the electric storage device include an electric storage element such as a capacitor, for example, an electrical double layer capacitor and a lithium ion capacitor, in addition to the secondary battery such as a lithium-ion battery, a lead battery, an NAS battery, and a redox flow battery, the secondary battery has been especially attracting attention.

A battery management unit for managing the secondary battery mounted on an electric powered working machine (battery excavator, plug-in hybrid excavator, and the like) can compute a full charge capacity of the secondary battery, can compute a remaining operating period and a remaining travel distance, and can diagnose a degradation level (State of Health: SOH) of the secondary battery. As a method for calculating the full charge capacity of the secondary battery, for example, as disclosed in Patent Literature 1, the calculation is performed by estimating an Open Circuit Voltage (OCV) from a voltage change after charging in rest periods provided at least twice or more during the charging, and using a charge rate (State of Charge: SOC) obtained from the estimated OCV and a charged electric charge amount.

CITATION LIST

Patent Literature

Patent Literature 1: JP 2013-070534 A

SUMMARY OF INVENTION

Technical Problem

However, while the electric powered working machine disclosed in Patent Literature 1 can decrease the calculation error of the full charge capacity of the secondary battery or an SOHQ as a degradation level of the secondary battery capacity by providing the rest periods, the total period of the charging is lengthened due to providing the rest periods, and possibly obstructs a work plan depending on the operation on the site.

It is an object of the present invention to provide an electric powered working machine capable of avoiding obstructing a work plan.

Solution to Problem

An electric powered working machine according to the present invention is an electric powered working machine with a secondary battery. The electric powered working machine comprises: a battery management unit that manages the secondary battery; and a controller that controls a normal charge without a rest period during charging or a diagnostic charge provided with a rest period during charging for the secondary battery. The controller includes: a diagnostic charge recommendation determination unit that determines whether to recommend the diagnostic charge or not based on an operation history of the secondary battery output from the battery management unit; and a diagnostic charge execution determination unit that determines whether to execute the diagnostic charge or not based on a state of the secondary battery output from the battery management unit, an estimated charge period necessary for the diagnostic charge, and a site work plan including a work start time, when the diagnostic charge is determined to be recommended.

In the electric powered working machine according to the present invention, the controller includes: a diagnostic charge recommendation determination unit that determines whether to recommend the diagnostic charge or not based on an operation history of the secondary battery output from the battery management unit; and a diagnostic charge execution determination unit that determines whether to execute the diagnostic charge or not based on a state of the secondary battery output from the battery management unit, an estimated charge period necessary for the diagnostic charge, and a site work plan including a work start time, when the diagnostic charge is determined to be recommended. Accordingly, by limiting the execution of the diagnostic charge provided with the rest period to the case where the diagnostic charge is determined to be recommended, the number of times of the diagnostic charge having the long total charge period can be reduced. Moreover, in consideration of the site work plan, by limiting the execution of the diagnostic charge to the case where the total charge period for the diagnostic charge can be allowed, the risk of obstructing the site work plan can be reduced. Consequently, it can be avoided to obstruct the work plan of the electric powered working machine.

Advantageous Effects of Invention

The present invention can avoid obstructing the work plan of the electric powered working machine.

BRIEF DESCRIPTION OF DRAWINGS

FIG. 7 is a table illustrating a relation between an open circuit voltage OCV and a charge rate SOC.

FIG. 8 is a setting table for a rest period.

DESCRIPTION OF EMBODIMENTS

Figure 1:
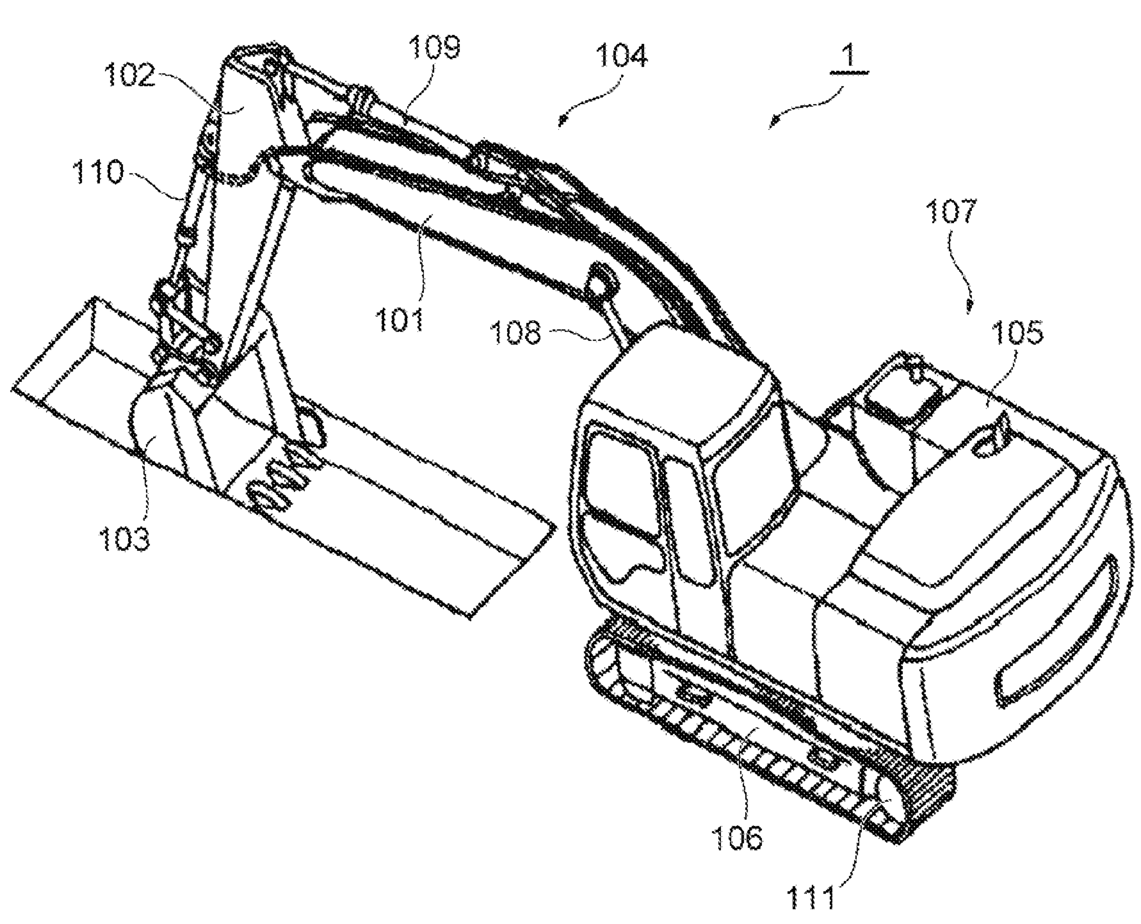
FIG. 1 is a perspective view illustrating an appearance of a battery excavator according to a first embodiment.

The following describes embodiments of an electric powered working machine according to the present invention with reference to the drawings. In descriptions of the drawings, the same reference numerals are given to the same elements, and therefore such elements will not be further elaborated here. While a battery type hydraulic excavator (hereinafter referred to as a battery excavator) will be described as an example of the electric powered working machine in the following description, the present invention is not limited to the battery excavator, and also applicable to an electric powered working machine such as a plug-in hybrid excavator.

First Embodiment

FIG. 1 is a perspective view illustrating an appearance of a battery excavator according to a first embodiment. As illustrated in FIG. 1, a battery excavator 1 includes an articulated working device 104 including a boom 101, an arm 102, and a bucket 103, and a vehicle body 107 including an upper rotary body 105 and a lower traveling body 106. The boom 101 is turnably supported by the upper rotary body 105, and driven by a boom cylinder (hydraulic cylinder) 108. The arm 102 is turnably supported by the boom 101, and driven by an arm cylinder (hydraulic cylinder) 109. The bucket 103 is turnably supported by the arm 102, and driven by a bucket cylinder (hydraulic cylinder) 110.

The upper rotary body 105 is driven to turn by a turning motor (electric motor), and the lower traveling body 106 is driven by right and left travelling motors (hydraulic motors) 111. The boom cylinder 108, the arm cylinder 109, the bucket cylinder 110, and the travelling motors 111 are driven by a pressure oil discharged from a hydraulic pump.

Figure 2:
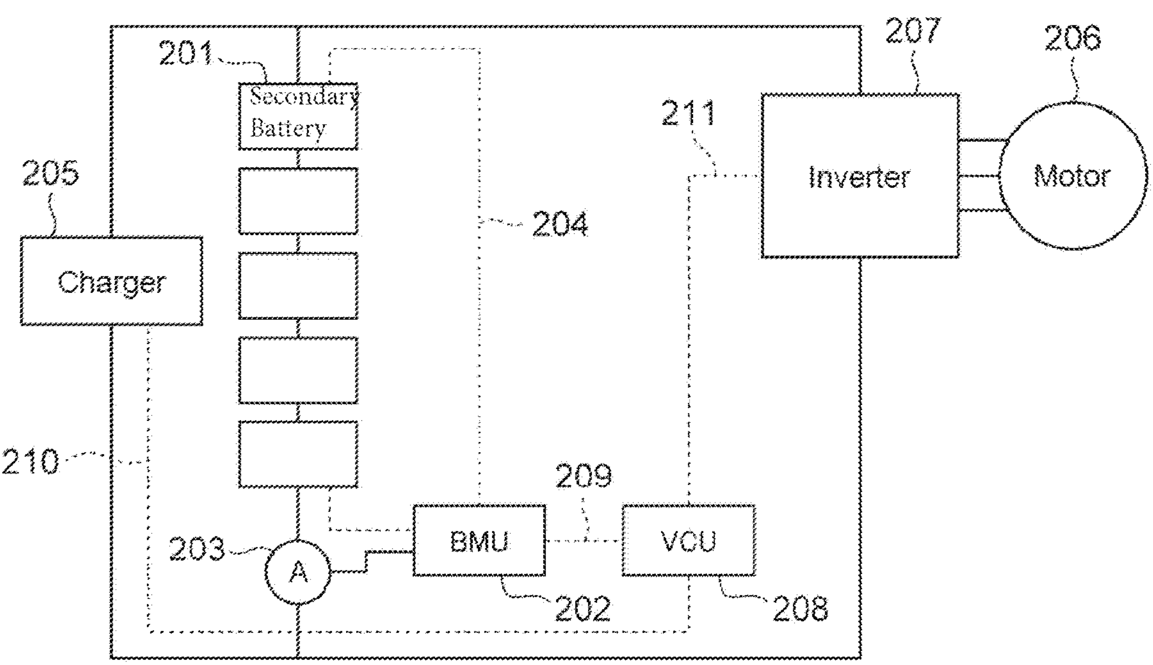
FIG. 2 is a block diagram illustrating a battery system of the battery excavator according to the first embodiment.

FIG. 2 is a block diagram illustrating a battery system of the battery excavator according to the first embodiment. A battery system 200 is mounted on the battery excavator 1, and includes a secondary battery 201, a battery management unit (Battery Management Unit: BMU) 202 for monitoring a state of the secondary battery 201, an ammeter 203 for detecting a current flowing to the secondary battery 201, a communication line 204 connecting the secondary battery 201 to the battery management unit 202, a charger 205 for charging the secondary battery 201, a motor 206 generating a mechanical power by an electric power of the secondary battery 201, an inverter 207 controlling the motor 206 while converting a DC power from the secondary battery 201 into an AC power, a vehicle control unit (Vehicle Control Unit: VCU) 208 controlling the charger 205 and the inverter 207 based on information on the state of the secondary battery 201 or the like output from the battery management unit 202, a communication line 209 connecting the battery management unit 202 to the vehicle control unit 208, a communication line 210 connecting the charger 205 to the vehicle control unit 208, and a communication line 211 connecting the inverter 207 to the vehicle control unit 208.

The secondary battery 201 is, for example, an assembly of battery modules each including a plurality of single cells, what is called an assembled battery. The battery module includes a plurality of series-connected single cells housed in a box. The battery modules are further connected in series or parallel, and each serve as one component of an assembled battery. In this embodiment, a lithium-ion battery having high input and output and a high energy density is used for the secondary battery. While the secondary battery 201 illustrated in FIG. 2 includes the battery modules connected in series, the secondary battery 201 may have a series-parallel configuration. Note that, in this case, the battery management unit 202 and the ammeter 203 are prepared for each series connection. The secondary battery 201 is configured to monitor voltages of the respective batteries and regularly transmit voltage values to the battery management unit 202 via the communication line 204.

The battery management unit 202 has a hardware configuration including an arithmetic processing unit (for example, CPU) for executing various control programs, a storage unit (for example, ROM, RAM) for storing various kinds of data including the control programs, and the like. The battery management unit 202 stores and manages, for example, an operation history of the secondary battery 201. The operation history of the secondary battery 201 includes information on charge history, discharge history, current time, temperature, and the like of the secondary battery 201.

The battery management unit 202 calculates a full charge capacity of the secondary battery 201 based on the voltages of the respective batteries obtained from the secondary battery 201, the current obtained via the ammeter 203, and the like. The calculation method of the full charge capacity will be described later. The battery management unit 202 calculates a charge rate SOC and a degradation level SOH of the entire secondary battery 201, and the SOC and the SOH of each battery module and each battery based on the calculated full charge capacity of the secondary battery. Further, the battery management unit 202 can calculate an SOHQ as a degradation level of the secondary battery capacity. The SOHQ as a degradation level of the secondary battery capacity is calculated based on, for example, Formula 1 below, and the charge rate SOC is calculated based on, for example, Formula 2 below.

$$SOHQ(\%) = 100 \times \text{current full charge capacity (Ah)/initial full charge capacity (Ah)} \quad \text{(Formula 1)}$$

$$SOC(\%) = 100 - 100 \times \text{discharge amount after full charge (Ah)/current full charge capacity (Ah)} \quad \text{(Formula 2)}$$

The battery management unit 202 stores a battery voltage OCV [V] at no load as specification information of the secondary battery 201. Since the value of OCV changes corresponding to the charge status (that is, charge rate SOC) of the secondary battery, the battery management unit 202 according to the embodiment stores the relation between SOC and OCV in a table format. The calculation method of SOC includes a method using the obtained battery voltage or an estimated OCV value and the relation table of SOC and OCV, in addition to Formula 2.

As the ammeter 203, for example, one using a shunt resistance or one using a Hall element is applicable. The current value detected by the ammeter 203 is output to the battery management unit 202. For the communication line 204, Local Interconnect Network (LIN), Controller Area Network (CAN), or the like can be used.

The charger 205 is to charge the secondary battery 201, and connected to the secondary battery 201. The charger 205 may be configured to be mounted on the battery excavator 1, or independently installed outside the battery excavator 1. The charging method of the charger 205 includes, for example, CCCV charging (Constant-Current Constant-Voltage charging) and a pulse charging method. The CCCV charging method is a method in which charging is performed in a constant current mode from the start of charging, and charging is performed in a constant voltage mode after the voltage reaches a voltage as a target of charging. On the other hand, the pulse charging is a method in which a pulse current is input for each certain predetermined period (for example, every few seconds), and charging is performed until the voltage reaches a voltage as a target of the charge.

In this embodiment, the charger 205 is configured to start or stop the charge of the secondary battery 201 based on the signal output from the vehicle control unit 208, and automatically stop the charge when the secondary battery 201 is fully charged. A configuration alternative to the charge rest signal includes a configuration in which a relay is connected to the existing charger and its switch is controlled. The CAN may be used for the communication line 210 for the control from the vehicle control unit 208, and the communication line 210 may be voltage lines indicating the ON/OFF state of the switch (two in total, one for transmitting a signal indicating the start of charging by the charger 205 (charge start signal) from the charger 205 to the vehicle control unit 208, and one for transmitting the charge rest signal from the vehicle control unit 208 to the charger 205).

The motor 206 is, for example, a turning motor for driving to turn the above-described upper rotary body 105.

Figure 3:
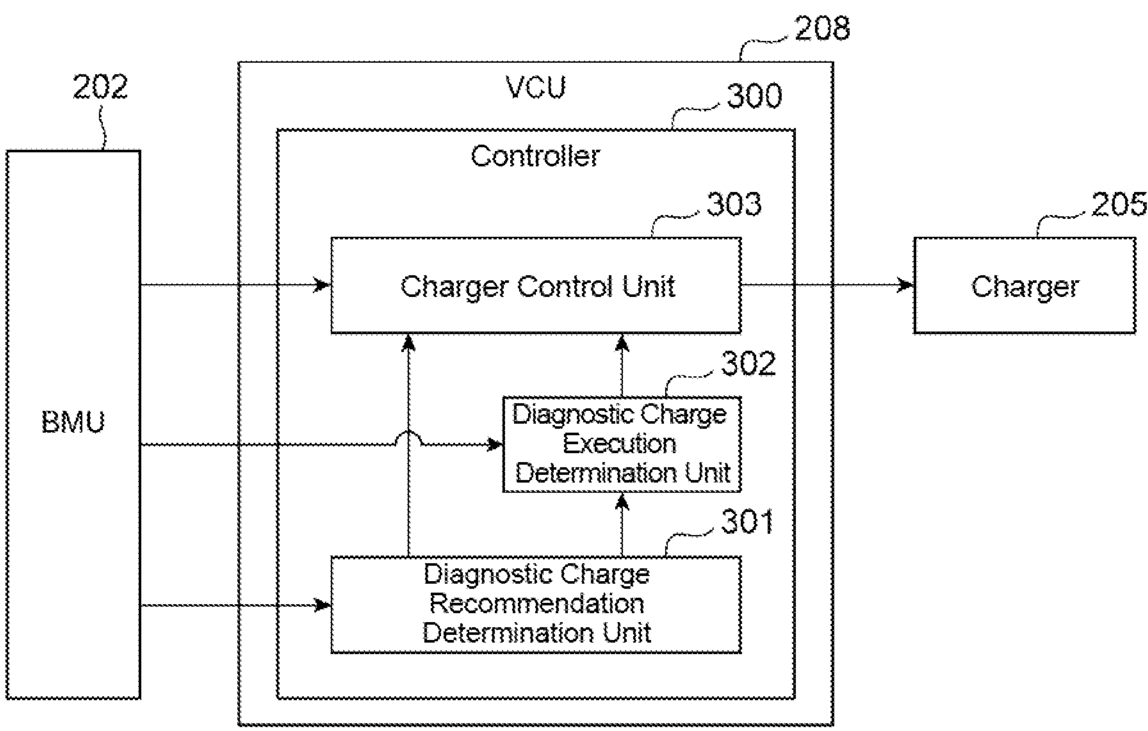
FIG. 3 is a function block diagram illustrating a controller disposed in a vehicle control unit.

FIG. 3 is a function block diagram illustrating a controller disposed in a vehicle control unit. As illustrated in FIG. 3, the vehicle control unit 208 includes a controller 300. The controller 300 performs a diagnostic charge recommendation determination and a diagnostic charge execution determination based on the information from the battery management unit 202, and controls the charge of the secondary battery 201 based on determination results. The controller 300 includes a diagnostic charge recommendation determination unit 301, a diagnostic charge execution determination unit 302, and a charger control unit 303.

The diagnostic charge recommendation determination unit 301 determines whether to recommend a diagnostic charge or not based on the information from the battery management unit 202. Specifically, the diagnostic charge recommendation determination unit 301 determines whether to recommend the diagnostic charge or not based on the operation history of the secondary battery 201 output from the battery management unit 202. Subsequently, the diagnostic charge recommendation determination unit 301 outputs the determination result to each of the diagnostic charge execution determination unit 302 and the charger control unit 303.

The diagnostic charge execution determination unit 302 determines whether to execute the diagnostic charge or not based on the state of the secondary battery 201 output from the battery management unit 202, an estimated charge period necessary for the diagnostic charge, and a site work plan that is a next work start time. Subsequently, the diagnostic charge execution determination unit 302 outputs the determination result to the charger control unit 303.

The charger control unit 303 controls a charge mode of the secondary battery 201 via the charger 205. The charge mode of the secondary battery 201 includes at least a normal charge and a diagnostic charge. The normal charge is a charge mode without a specific restriction or the like, and specifically, a rest period is not provided during the charge. On the other hand, the diagnostic charge is a charge mode provided with a rest period during the charge. In this embodiment, the diagnostic charge is preferably a charge including preset rest periods before and after charging, and further preferably a charge in which a ΔSOC by charging is equal to or more than a predetermined value in addition to including the preset rest periods before and after charging. Accordingly, the calculation error in the full charge capacity, the SOHQ, or the like of the secondary battery 201 can be suppressed. The ΔSOC is an SOC change amount before and after charging.

Figure 4:
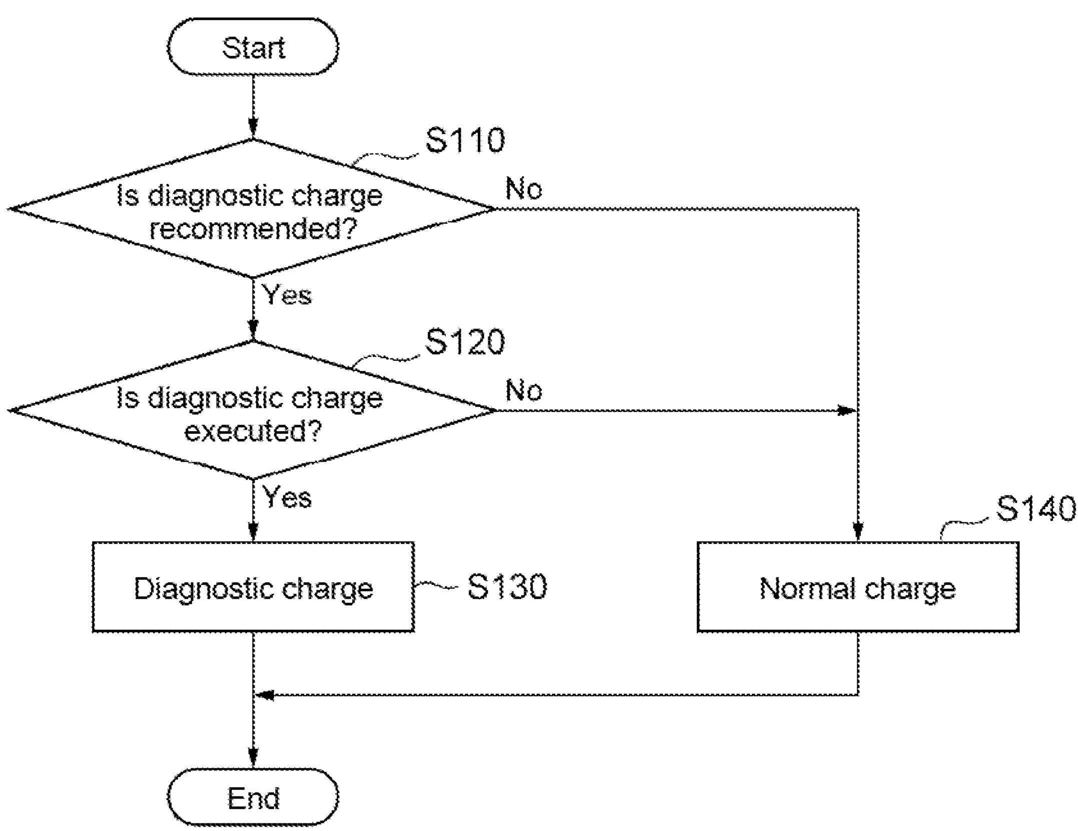
FIG. 4 is a flowchart illustrating a charge control for a secondary battery.

Next, the charge control to the secondary battery 201 will be described based on FIG. 4. The control process illustrated in FIG. 4 is started in a state where the charge operation of the battery excavator 1 is started, for example, a current cable is connected.

First, in Step S110, the diagnostic charge recommendation determination unit 301 determines whether to recommend the diagnostic charge or not based on the operation history of the secondary battery 201 output from the battery management unit 202. The operation history of the secondary battery 201 is, for example, a charge history, a discharge history, a current time, a temperature, or the like. The specific determination method will be described later. When it is determined to recommend the diagnostic charge, the control process proceeds to Step S120.

In Step S120, the diagnostic charge execution determination unit 302 determines whether to execute the diagnostic charge or not based on the state of the secondary battery 201 output from the battery management unit 202, the estimated charge period necessary for the diagnostic charge, and the site work plan that is a work start time. The specific determination method will be described later. The state of the secondary battery 201 here includes the charge status of the secondary battery 201, the temperature state of the secondary battery 201, or the like. When it is determined to execute the diagnostic charge, the control process proceeds to Step S130.

In Step S130, the charger control unit 303 prepares a diagnostic charge pattern based on the information such as the state of the secondary battery 201 output from the battery management unit 202, and controls the diagnostic charge of the secondary battery 201 via the charger 205 with the prepared charge pattern.

Meanwhile, when it is determined not to recommend the diagnostic charge in Step S110, or when it is determined not to execute the diagnostic charge in Step S120, the control process proceeds to Step S140. In Step S140, the charger control unit 303 determines a charge current based on the information such as the state of the secondary battery 201 output from the battery management unit 202, and controls the normal charge of the secondary battery 201 via the charger 205.

Figure 5:
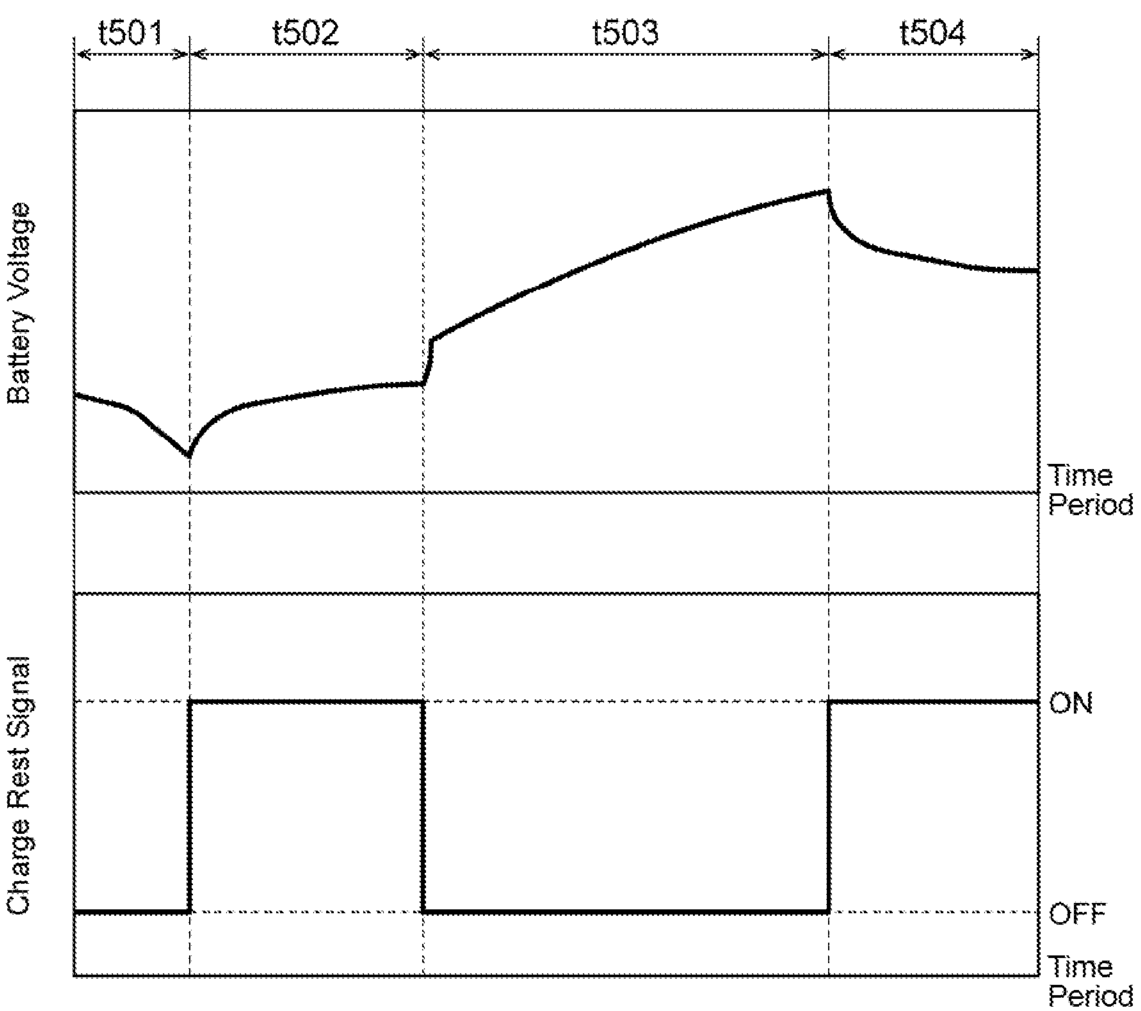
FIG. 5 is a drawing illustrating exemplary temporal changes of a battery voltage and a charge rest signal in a diagnostic charge.

Here, the diagnostic charge will be described in detail based on FIG. 5. FIG. 5 is a drawing illustrating exemplary temporal changes of a battery voltage and a charge rest signal in a diagnostic charge.

As illustrated in FIG. 5, the diagnostic charge includes preset rest periods before and after charging. Specifically, a certain post-operation rest period t502 is provided after a discharge period (in other words, operating period of the battery excavator 1) t501 of the secondary battery 201 and before the charge of the secondary battery 201. The secondary battery 201 is charged in a charge period t503 after the post-operation rest period t502. A certain post-charge rest period t504 is further provided after the charge period t503. In the normal charge, the rest period such as the post-operation rest period t502 and the post-charge rest period t504 as provided in the diagnostic charge is not provided.

While FIG. 5 illustrates an example in which the charge period t503 is provided once, the number of the charge periods is not limited. For example, a pre-charge period may be provided after the post-operation rest period t502. After the pre-charge period, a completing charge (that is, charge period t503) is performed.

Next, the calculation of the full charge capacity and the SOHQ of the secondary battery by the battery management unit 202 will be described.

In the diagnostic charge, the battery management unit 202 calculates the full charge capacity and the SOHQ of the secondary battery 201 based on operation history data such as a current during charging. Meanwhile, also in the normal charge, the battery management unit 202 calculates the full charge capacity and the SOHQ of the secondary battery 201 based on operation history data such as a current during charging as well. Additionally, the battery management unit 202 processes the full charge capacity and the SOHQ calculated based on the operation history in the diagnostic charge as current state values of the secondary battery 201 during the diagnostic charge. The operation history in the diagnostic charge includes the charge history, the discharge history, the current time, the temperature, and the like in addition to the charge current of the secondary battery 201 during the diagnostic charge. Meanwhile, in the normal charge, the battery management unit 202 processes the full charge capacity and the SOHQ calculated based on the operation history in the normal charge as reference values. The operation history in the normal charge includes the charge history, the discharge history, the current time, the temperature, and the like in addition to the charge current of the secondary battery 201 during the normal charge.

Figure 6:
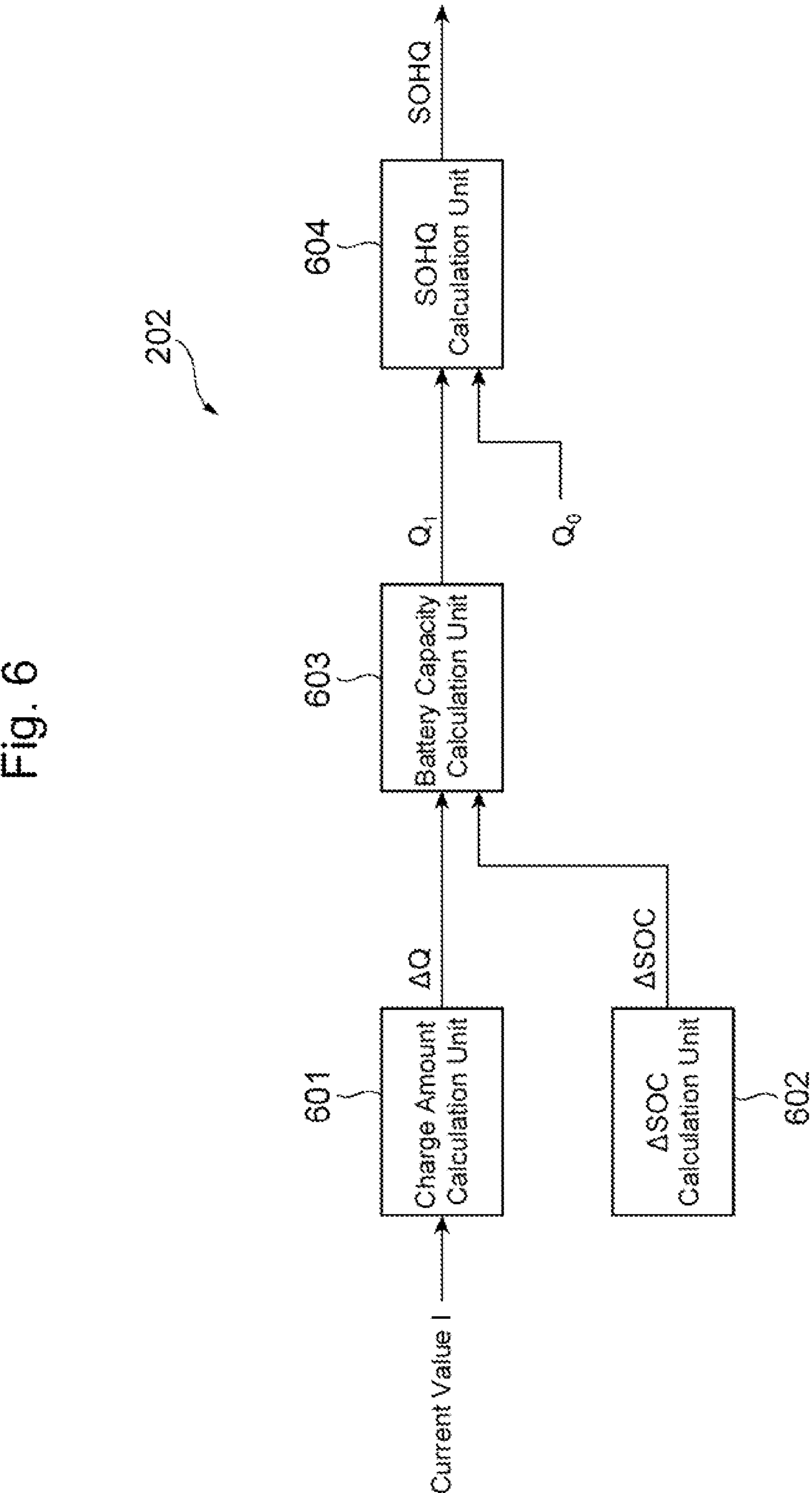
FIG. 6 is a block diagram illustrating a calculation of a full charge capacity and an SOHQ in a battery management unit.

FIG. 6 is a block diagram illustrating a calculation of a full charge capacity and an SOHQ in a battery management unit 202. As illustrated in FIG. 6, the battery management unit 202 includes a charge amount calculation unit 601, a ΔSOC calculation unit 602, a battery capacity calculation unit 603, and an SOHQ calculation unit 604. The charge amount calculation unit 601 calculates a charged electric charge amount ΔQ based on Formula 3 using a current I obtained via the ammeter 203, and outputs the calculation result to the battery capacity calculation unit 603.

$$\text{Charged electric charge amount } \Delta Q \text{ (Ah)} = \int I dt \quad \text{(Formula 3)}$$

The ΔSOC calculation unit 602 calculates a ΔSOC that is an SOC change amount before and after charging, and outputs the calculation result to the battery capacity calculation unit 603. The battery capacity calculation unit 603 calculates a current full charge capacity Q (see $Q_1$ in FIG. 6) based on Formula 4 using the charged electric charge amount ΔQ and the SOC change amount ΔSOC.

$$\text{Current full charge capacity } Q \text{ (Ah)} = \text{charged electric charge amount } \Delta Q \times 100/SOC \text{ change amount } \Delta SOC \quad \text{(Formula 4)}$$

The SOHQ calculation unit 604 calculates the SOHQ based on the above-described Formula 1 using the current full charge capacity Q (see $Q_1$ in FIG. 6) and an initial full charge capacity $Q_0$.

Here, the method for calculating the SOC change amount ΔSOC before and after charging will be described by referring to a table of FIG. 7.

FIG. 7 is a table illustrating a relation between an open circuit voltage OCV and a charge rate SOC. This table is stored in, for example, a storage unit of the battery management unit 202. First, the battery management unit 202 estimates an OCV ($OCV_1$) at the end of the post-operation rest period t502 based on the operation history of the secondary battery 201 (estimation method will be described later), and estimates an SOC ($SOC_1$) before charging from the estimated $OCV_1$ using the table of FIG. 7. For example, when the estimated $OCV_1$ is 3.2 V, the $SOC_1$ is 20%.

Next, the battery management unit 202 estimates an OCV ($OCV_2$) at the end of the post-charge rest period t504 based on the operation history of the secondary battery 201, and estimates an SOC ($SOC_2$) after charging from the estimated $OCV_2$ using the table of FIG. 7. Next, the battery management unit 202 calculates a ΔSOC by obtaining a difference between the $SOC_1$ and the $SOC_2$ before and after charging.

Examples of the method for estimating the OCV includes a method using a battery equivalent circuit model. The OCV is obtained based on, for example, Formula 5. In Formula 5, $R_0$ indicates an internal resistance, $V_{P1}$ indicates a voltage drop due to polarization, and CCV indicates a closed circuit voltage (Closed Circuit Voltage). $V_{P1}$ is a voltage gap from the OCV caused by an electrochemical reaction of the secondary battery, and indicated by, for example, a formula of first-order lag like Formula 6. Rp1 indicates a polarization resistance, t indicates an elapsed time, and τ indicates a polarization time constant. While the number of the parameters of the first-order lag is one in Formula 6, it may be two or more. Additionally, the battery management unit 202 calculates the OCV using a parameter table of R0, Rp1, and τ prepared through the battery characteristic evaluation in advance, the operation history data on the current or the like, and Formula 7 obtained by Formulas 5 to 6.

$$OCV(V) = CCV - I \times R_0 - V_{P1} \quad \text{(Formula 5)}$$

$$V_{P1}(V) = I \times R_{P1} \times \{1 - \exp((-t)/\tau)\} \quad \text{(Formula 6)}$$

$$OCV(V) = CCV - I \times R_0 - I \times R_{P1} \times \{1 - \exp((-t)/\tau)\} \quad \text{(Formula 7)}$$

While the calculation method using the OCV before and after charging for the calculation of the ΔSOC is described above, the voltage values at the end of the post-operation rest period t502 and at the end of the post-charge rest period t504 may be used instead of the OCV.

In the diagnostic charge, the set values of the rest periods of the post-operation rest period t502 and the post-charge rest period t504 are preferably those for periods enough to accurately calculate the OCV using Formula 7 or those for periods in which the polarization inside the secondary battery 201 is sufficiently reduced and the OCV is converged before and after charging the secondary battery. The set values are preferably prepared in a table format in advance, and stored in the storage unit of the battery management unit 202.

Since it is considered that the rest periods of the post-operation rest period t502 and the post-charge rest period t504 change depending on the temperature or the SOC, for example, the setting like the table illustrated in FIG. 8 can be made. While the set values of the rest period in predetermined temperature range and the SOC range are illustrated in FIG. 8, the table may include only the temperature range or only the SOC range. The set values of the rest period in FIG. 8 may be values determined by a test in advance, or may be values based on the polarization time constant $\tau$ in Formula 6. The polarization time constant $\tau$ has a correlation with a time period taken for the reduction of the polarization inside the secondary battery 201. When a time period of the polarization time constant $\tau$ is elapsed, 67% of the polarization voltage disappears, and when a time period of three times of the polarization time constant $\tau$ is elapsed, 99.5% of the polarization voltage disappears.

Note that, while the normal charge does not include the rest period for a long time like the post-operation rest period and the post-charge rest period in the diagnostic charge, the normal charge may be provided with the rest period for a short period. The rest period for the normal charge is a value preliminarily set on a premise of not obstructing the operation of the battery excavator 1, and for example, one minute.

In the diagnostic charge, the ΔSOC by charging is equal to or more than a predetermined value $k_{\Delta SOC}$. The full charge capacity Q is calculated based on Formula 4 using the charged electric charge amount and the ΔSOC. When the ΔSOC is small, the influence of the error in the calculation of the charged electric charge amount and the ΔSOC generated depending on the detection accuracy of the ammeter 203, the detection accuracy of the voltmeter, or the SOC calculation accuracy is significant, and the errors of the full charge capacity Q and the SOHQ increase. Therefore, the ΔSOC is preferably large. The predetermined value $k_{\Delta SOC}$ is preliminarily determined from the target accuracies of the full charge capacity Q and the SOHQ, assumed accuracies in the calculations of the charged electric charge amount and the ΔSOC, and the like. For example, when it is assumed that the error of the charged electric charge amount is ignored for simplification and the error in the ΔSOC calculation is x %, the errors of the full charge capacity Q and the SOHQ are indicated by Formula 8. When the target accuracies of the full charge capacity Q and the SOHQ are 5% and x is 2%, the ΔSOC satisfying them, that is, the predetermined value $k_{\Delta SOC}$ is 38%.

$$(\Delta Q/\Delta SOC-(\Delta Q/(\Delta SOC-x)))/(\Delta Q/\Delta SOC)\times 100 = -x/(\Delta SOC-x)\times 100 \quad \text{(Formula 8)}$$

Next, the method for determining the diagnostic charge recommendation in Step S110 of FIG. 4 will be described in detail.

As described above, in Step S110, the diagnostic charge recommendation determination unit 301 determines whether to recommend the diagnostic charge or not based on the operation history of the secondary battery 201 output from the battery management unit 202. More specifically, the diagnostic charge recommendation determination unit 301 determines whether the current full charge capacity Q and SOHQ are deviated from the calculation values of the full charge capacity and the SOHQ calculated in the previous diagnostic charge based on the operation history of the secondary battery 201 output from the battery management unit 202. When it is determined to be deviated, the diagnostic charge recommendation determination unit 301 recommends the diagnostic charge, and when it is determined not to be deviated, the diagnostic charge recommendation determination unit 301 does not recommend the diagnostic charge. Specific examples of the determination method will be described below.

[Recommendation Determination Method 1]

In the recommendation determination method 1, the diagnostic charge recommendation determination unit 301 determines whether to recommend the diagnostic charge or not based on the information on the date of starting the use of the battery excavator 1, the date of performing the previous diagnostic charge, and the current time extracted from the operation history of the secondary battery 201 output from the battery management unit 202. Since the secondary battery 201 deteriorates due to the time passage or charge and discharge, the use for a certain period or more progresses the degradation, that is, the SOHQ decreases. In this case, the diagnostic charge recommendation determination unit 301 determines to recommend the diagnostic charge.

As indicated by Formula 9, when the battery excavator 1 is used in a state where the diagnostic charge has not been executed immediately after the start of using the battery excavator 1, and a current time $t_C$ is a time at which a predetermined time period $k_t$ or more has elapsed after a date $t_S$ of starting the use of the battery excavator 1, it is determined to recommend the diagnostic charge. Additionally, when the current time $t_C$ is a time at which the predetermined time period $k_t$ or more has elapsed after a date $t_D$ of executing the previous diagnostic charge, it is determined to recommend the diagnostic charge using Formula 10 after executing the diagnostic charge once or more.

$$t_C - t_S \geq k_t \quad \text{(Formula 9)}$$

$$t_C - t_D \geq k_t \quad \text{(Formula 10)}$$

The predetermined time period $k_t$ is a time period preliminarily determined based on the degradation transition of the secondary battery 201, and may be, for example, a value of one month, three months, a half year, or more. The predetermined time period $k_t$ may be a constant value, or may change corresponding to the total operating period of the battery excavator 1. While the battery degradation depends on the use method of the secondary battery 201, the battery degradation is remarkable at the beginning of the use, and the degradation speed gradually decreases. Therefore, for example, the predetermined time period $k_t$ may be set to two weeks or one month within a year after the start of use, and the predetermined time period $k_t$ may be set to three months or a half year after the elapse of one year from the start of use.

[Recommendation Determination Method 2]

In the recommendation determination method 2, the diagnostic charge recommendation determination unit 301 determines whether to recommend the diagnostic charge or not based on an SOHQ calculation value in the previous diagnostic charge (which is an initial value when the diagnostic charge has not been executed) and an SOHQ change amount ΔSOHQ output from the battery management unit 202. The SOHQ change amount ΔSOHQ is obtained from a current estimated SOHQ value calculated based on the operation history such as a current using a degradation prediction function of the secondary battery 201.

The secondary battery deteriorates due to the time passage or charge and discharge, and the degradation speed depends on the usage environment such as a temperature, a current, and an SOC. Therefore, the degradation level SOHQ of the secondary battery is indicated by a degradation prediction function f(T, I, SOC, t) of a temperature T, a current I, an SOC, and an elapsed time t, and generally established based on the result of a test performed in advance test.

Figure 9:
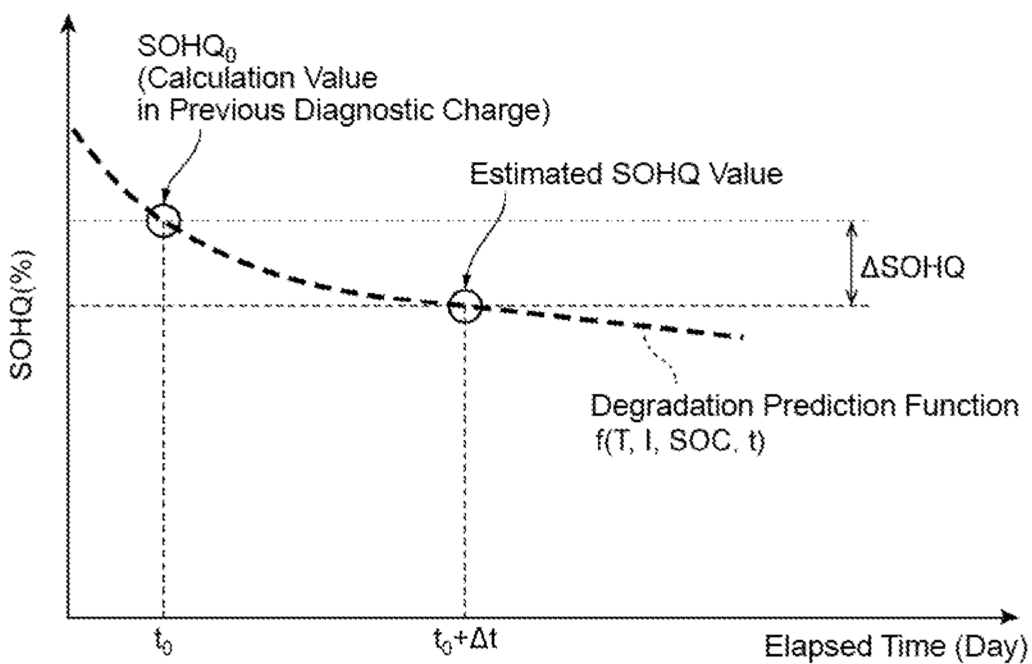
FIG. 9 is an explanatory view of a ΔSOHQ.

FIG. 9 illustrates an explanatory view of the ΔSOHQ. A difference between a calculation value $SOHQ_0$ in the previous diagnostic charge and a current ($t_0+\Delta t$ in FIG. 9) estimated SOHQ value calculated based on the operation history from the previous diagnostic charge using the degradation prediction function f(T, I, SOC, t) is defined as the ΔSOHQ. In this recommendation determination method, when the ΔSOHQ becomes a threshold $k_{Q1}$ or more, the degradation progresses, that is, the SOHQ is determined to be decreased, and it is determined to recommend the diagnostic charge. The threshold $k_{Q1}$ is any value determined in advance, and may be a value of 1%, 2%, or more.

[Recommendation Determination Method 3]

In the recommendation determination method 3, the diagnostic charge recommendation determination unit 301 determines whether to recommend the diagnostic charge or not based on the result of analyzing an SOHQ change from the SOHQ calculation value in the previous diagnostic charge (which is an initial value when the diagnostic charge has not been executed) and the SOHQ calculation value in the normal charge (reference value) output from the battery management unit 202.

As indicated by Formula 11, when a difference between an average value $SOHQ_{R,A(N)}$ of the latest N points of the SOHQ calculation values (reference value) and the SOHQ calculation value $SOHQ_0$ in the previous diagnostic charge becomes a threshold $k_{Q2}$ or more, the degradation progresses, that is, the SOHQ is determined to be decreased, and it is determined to recommend the diagnostic charge in this case.

$$SOHQ_{R,A(N)} - SOHQ_0 \geq k_{Q2} \quad \text{(Formula 11)}$$

Since the rest period necessary for reducing the polarization is not sufficient in the normal charge, the error and the variation are large in the SOHQ calculation value (reference value) in the normal charge. Therefore, for analyzing the SOHQ change after the previous diagnostic charge, the average value of the latest N points is obtained. The number N used for the average is any value determined in advance, and determined from, for example, a calculation error of the SOHQ calculation value in the diagnostic charge and the SOHQ calculation value (reference value) in the normal charge. When the error in the SOHQ calculation in the diagnostic charge is 5%, and the error in the SOHQ calculation in the normal charge is from 20% to 25%, since the error of the average value relative to the sample number N depends on √N, the number N is preferably 25 points or more.

In the calculation of the average value, outliers may be removed. As a method for determining the outliers, the Smirnov-Grubbs test, a method using interquartile range, or the like may be used. In consideration of the contents of the above description, for example, the number N is determined as 30 points. The normal charge of 30 times corresponds to the number of pieces of data of two weeks when assuming that the number of charge is three times a day and the number of operating days is five days a week. The threshold $k_{Q2}$ is any value determined in advance, and may be a value of 1%, 2%, or more.

[Recommendation Determination Method 4]

In the recommendation determination method 4, the diagnostic charge recommendation determination unit 301 determines whether to recommend the diagnostic charge or not based on a difference between an SOC range during operation and an SOC range during charging. The SOC range during operation is calculated based on the full charge capacity or the SOHQ calculation value of the secondary battery in the previous diagnostic charge output from the battery management unit 202 (when the diagnostic charge is not executed, the initial value of the full charge capacity of the secondary battery or the degradation level of the secondary battery capacity). The SOC range during charging is calculated from the operation history of the normal charge.

Specifically, a description will be given using Formula 12. In Formula 12, $\Delta SOC_D$ is an amount of SOC change by operating the battery excavator 1 (discharge of the secondary battery 201) after the activation or completion of the previous charge of the battery excavator 1, and calculated based on a discharged electric charge amount $\int I_D dt$ by the operation and a calculation value $Q_0$ of the secondary battery full charge capacity in the previous diagnostic charge. $\Delta SOC_{R,C}$ is a ΔSOC calculated in a process of the calculation of the secondary battery full charge capacity or the SOHQ in the normal charge.

In a difference between the $\Delta SOC_D$ and the $\Delta SOC_{R,C}$, when the average value of the latest N points becomes a threshold $k_{Q3}$ or less, the SOC operates in a range wider than the SOC operating range calculated based on the secondary battery full charge capacity in the previous diagnostic charge, that is, it is determined that the degradation has progressed compared with the previous diagnostic charge and the SOHQ has decreased, and it is determined to recommend the diagnostic charge.

$$(\Delta SOC_D - \Delta SOC_{R,C})_{A(N)} = \left(\int I_D dt / Q_0 - \Delta SOC_{R,C}\right)_{A(N)} \leq k_{Q3} \quad \text{(Formula 12)}$$

As described in the recommendation determination method 3, since the error and the variation are large also in the ΔSOC calculation in the normal charge, the average value of the latest N points is obtained. The number N used for the average is any value determined in advance, and in consideration of the calculation error in the normal charge, the number N is set to, for example, 30 points. The threshold $k_{Q3}$ is any value determined in advance, and may be a value of −1%, −2%, or less.

Next, the method for determining the diagnostic charge execution of Step S120 will be described in detail.

As described above, in Step S120, the diagnostic charge execution determination unit 302 determines whether to execute the diagnostic charge or not based on the state of the secondary battery 201 output from the battery management unit 202, the estimated charge period necessary for the diagnostic charge, and the site work plan that is a work start time. Here, the diagnostic charge execution determination unit 302 determines to execute the diagnostic charge only when the relations of Formula 13 and Formula 14 below are all satisfied. Therefore, for example, when the relation of Formula 13 is satisfied while the relation of Formula 14 is not satisfied, or when the relation of Formula 13 is not satisfied while the relation of Formula 14 is satisfied, it is not determined to execute the diagnostic charge.

Specifically, as described above, the ΔSOC by charging is equal to or more than the predetermined value $k_{\Delta SOC}$ in the diagnostic charge. Therefore, the diagnostic charge execution determination unit 302 calculates a difference $\Delta SOC_C$ between a preset SOC set value (maximum) $SOC_{C,Max}$ of charging and a current SOC before charging output from the battery management unit 202, and determines whether the calculated difference $\Delta SOC_C$ is equal to or more than the predetermined value $k_{\Delta SOC}$ or not as indicated by Formula 13.

$$\Delta SOC_C = SOC_{C,Max} - SOC_{Cur} \geq k_{\Delta SOC} \quad \text{(Formula 13)}$$

Subsequently, the diagnostic charge execution determination unit 302 determines whether a remaining charge available period $time_{ava}$ is equal to or more than an estimated charge period $time_{Charge,D}$ necessary for the diagnostic charge or not as indicated by Formula 14 based on the remaining charge available period $time_{ava}$ calculated from the site work plan (that is, use start time of the secondary battery) that is the work start time preliminarily registered as data in the vehicle control unit 208 and the estimated charge period $time_{Charge,D}$ necessary for the diagnostic charge calculated by the battery management unit 202.

$$time_{ava} \geq time_{Charge,D} \quad \text{(Formula 14)}$$

The remaining charge available period $time_{ava}$ is calculated from a difference between the current time and the next work start time (from the current time to the next use start time of the secondary battery 201) by the battery management unit 202. The estimated charge period $time_{Charge,D}$ necessary for the diagnostic charge is also referred to as a total charge period, and is a summed value of the charge period (t503) $time_{Charge}$, the post-operation rest period (t502) $time_{R,before}$, and the post-charge rest period (t504) $time_{R,after}$ as indicated by Formula 15.

$$time_{Charge,D} = time_{Charge} + time_{R,before} + time_{R,after} \quad \text{(Formula 15)}$$

The charge period $time_{Charge}$ is calculated from, for example, a charge period using the CCCV charging method. As described above, the CCCV charging method is a method in which charging is performed in a constant current mode from the start of charging, and charging is performed in a constant voltage mode after the voltage reaches a voltage of SOC as a target of charging. The charge period $time_{Charge}$ can be simply calculated with Formula 16.

$$time_{Charge} = time_{Charge,CC} + time_{Charge,CV} = \Delta Qc/Ic + time_{Charge,CV} = (SOC_{C,Max} - SOC_{Cur})/100 \times Q_0/I_C + time_{Charge,CV} \quad \text{(Formula 16)}$$

As indicated by Formula 16, the charge period $time_{Charge}$ is calculated using a sum of a CC charge period $time_{Charge,CC}$ calculated from an electric charge amount ΔQc necessary for charging and the charge current $I_C$, and a CV charge period $time_{Charge,CV}$. The CV charge period $time_{Charge,CV}$ is a value preliminarily determined based on the battery performance for enabling the sufficient charge to the SOC set value (maximum) $SOC_{C,Max}$, and may be a constant value, for example, one hour, or may be a value calculated based on a function formula or Map depending on the state of the secondary battery 201 such as the cell temperature, SOC, and SOH. The post-operation rest period $time_{R,before}$ and the post-charge rest period $time_{R,after}$ are obtained based on the state of the secondary battery 201 such as a cell temperature and SOC, and a rest period Map illustrated in FIG. 8.

Figure 10:
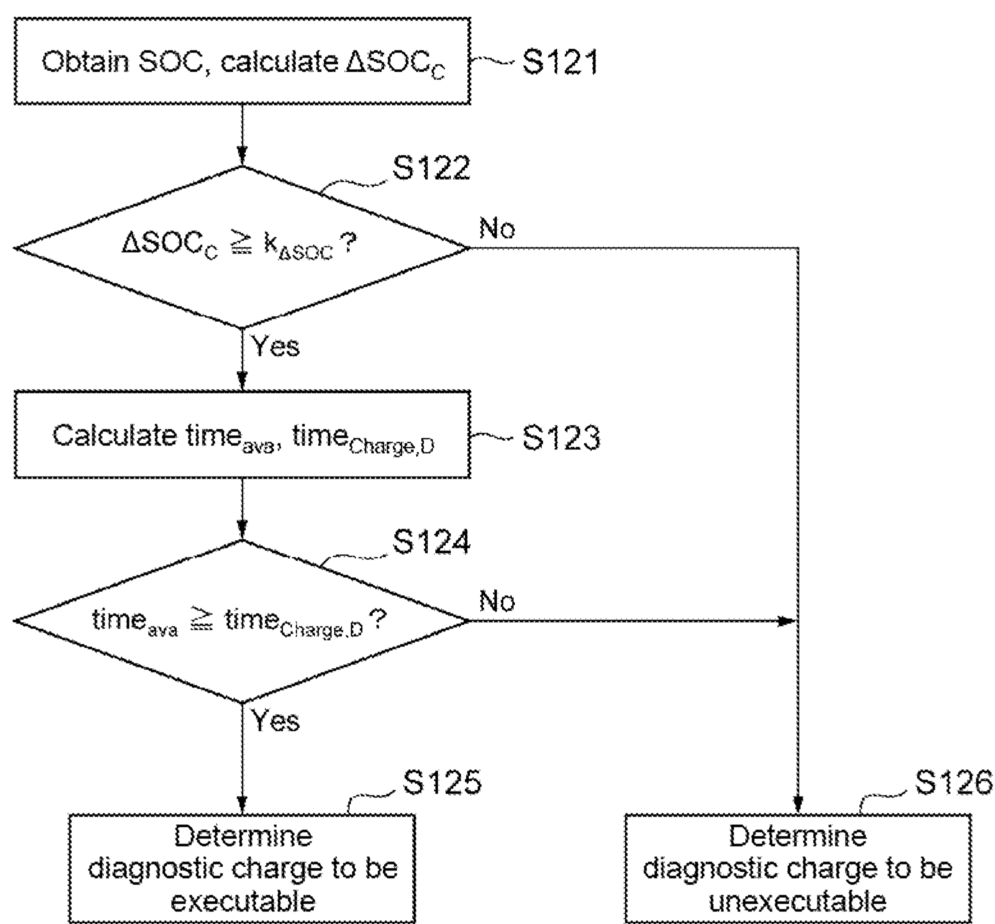
FIG. 10 is a flowchart illustrating a diagnostic charge execution determination.

The detailed process of the diagnostic charge execution determination in Step S120 is illustrated in, for example, a flowchart of FIG. 10. First, in Step S121, the ΔSOC calculation unit 602 of the battery management unit 202 obtains the current secondary battery charge status SOC output from the battery management unit 202 as described above, and further, calculates the $\Delta SOC_C$ based on the preset SOC set value (maximum) $SOC_{C,Max}$ of charging and the obtained SOC using Formula 13.

In Step S122 subsequent to Step S121, the diagnostic charge execution determination unit 302 obtains the $\Delta SOC_C$ calculated by the ΔSOC calculation unit 602, and determines whether the obtained $\Delta SOC_C$ is equal to or more than the predetermined value $k_{\Delta SOC}$ or not. When the $\Delta SOC_C$ is determined to be equal to or more than the predetermined value $k_{\Delta SOC}$, the control process proceeds to Step S123. In Step S123, the remaining charge available period $time_{ava}$ and the estimated charge period $time_{Charge,D}$ necessary for the diagnostic charge are each calculated. In Step S124 subsequent to Step S123, the diagnostic charge execution determination unit 302 determines whether the calculated $time_{ava}$ is equal to or more than the $time_{Charge,D}$ or not. When the $time_{ava}$ is determined to be equal to or more than the $time_{Charge,D}$, the diagnostic charge execution determination unit 302 finally determines that the diagnostic charge is executable (in other words, determines to execute the diagnostic charge) (see Step S125).

Meanwhile, when the $\Delta SOC_C$ is determined to be smaller than the predetermined value $k_{\Delta SOC}$ in Step S122, or when the $time_{ava}$ is determined to be smaller than the $time_{Charge,D}$ in Step S124, the diagnostic charge execution determination unit 302 finally determines that the diagnostic charge is unexecutable (in other words, determines not to execute the diagnostic charge) (see Step S126).

In Step S124 described above, when the estimated charge period $time_{Charge,D}$ necessary for the diagnostic charge increases due to the low cell temperature of the secondary battery, and the diagnostic charge is unexecutable, the cell temperature may be raised by a warm-up operation. In this case, the control process of FIG. 11 in which the warm-up process is added to the control process of FIG. 10 is performed (see FIG. 11).

Figure 11:
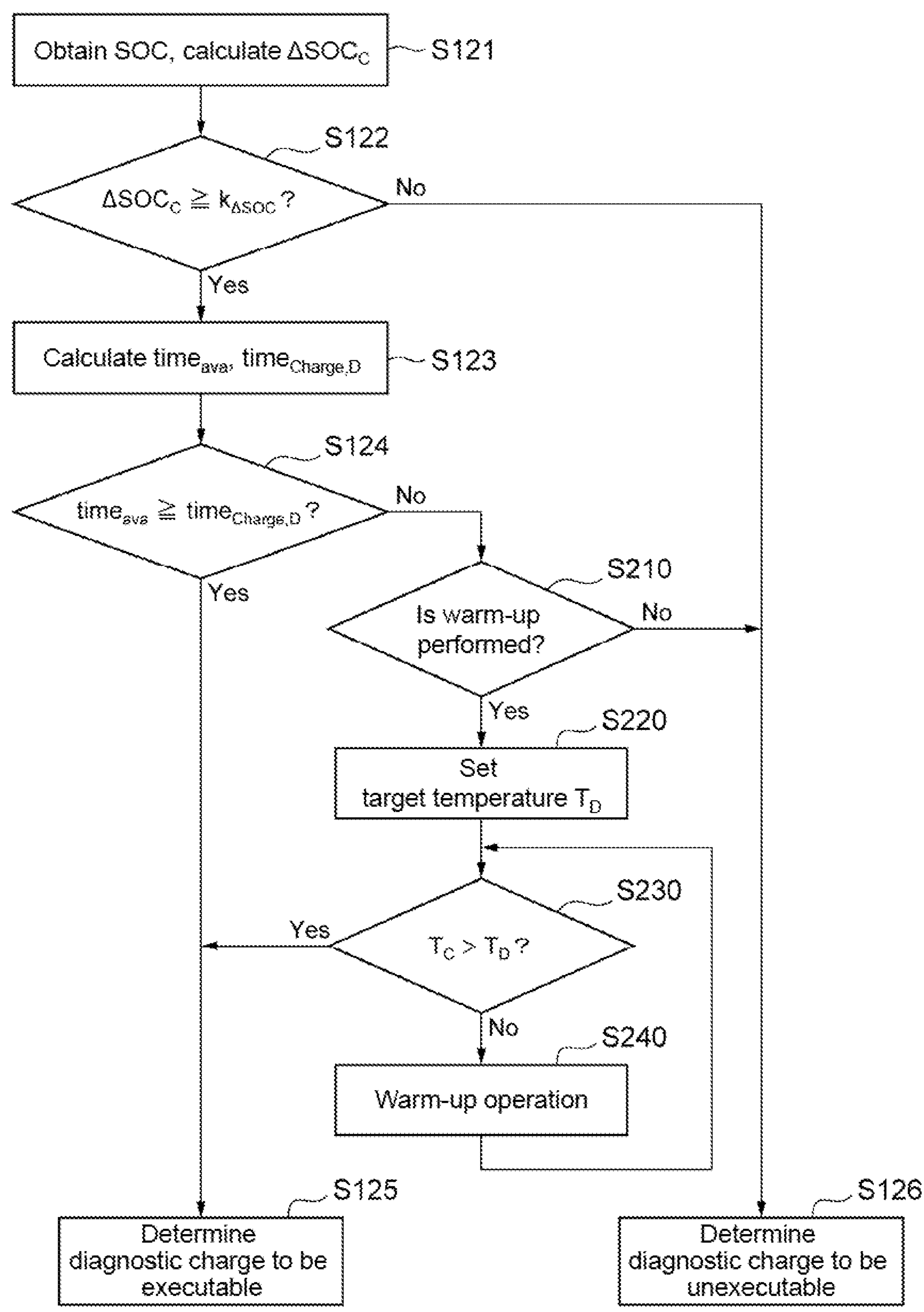
FIG. 11 is another flowchart illustrating the diagnostic charge execution determination.

Since Step S121 to Step S125 illustrated in FIG. 11 are similar to those of FIG. 10, the repeated explanations are omitted, and only the different steps (that is, steps relating to the warm-up process) will be described below. Specifically, when the $time_{ava}$ is determined to be smaller than the $time_{Charge,D}$ in Step S124, the control process proceeds to Step S210, and the availability of the warm-up process is determined. Here, because of the cell temperature rise within a predetermined range due to the warm-up, whether the estimated charge period $time_{Charge,D}$ necessary for the diagnostic charge and the remaining charge available period $time_{ava}$ satisfy the relation of Formula 14 or not is determined, a target value (target temperature) $T_D$ of the cell temperature by the warm-up is calculated, and whether the warm-up can be performed with an energy remaining amount based on the SOC or the like or not is determined. The target temperature $T_D$ is a temperature at which the estimated charge period $time_{Charge,D}$ necessary for the diagnostic charge and the remaining charge available period $time_{ava}$ satisfy the relation of Formula 14.

In Step S210, when the warm-up is determined to be allowed, the control process proceeds to Step S220. In Step S220, the target temperature $T_D$ in the warm-up operation is set. In Step S230 subsequent to Step S220, the diagnostic charge execution determination unit 302 determines whether the cell temperature $T_C$ is larger than the target temperature $T_D$ or not. When the cell temperature $T_C$ is determined to be larger than the target temperature $T_D$, the control process proceeds to Step S125 described above, and it is determined that the diagnostic charge can be executed.

Meanwhile, when the cell temperature $T_C$ is determined to be equal to or less than the target temperature $T_D$ in Step S230, the control process proceeds to Step S240, and the warm-up operation is performed. Such a warm-up operation is repeated until the cell temperature $T_C$ reaches the target temperature $T_D$. Note that when the warm-up is determined not to be allowed in Step S210, the control process proceeds to Step S126 described above, and the diagnostic charge is determined to be unexecutable.

While the method for calculating the secondary battery capacity and the degradation level SOHQ of the capacity based on the operation history data such as a voltage, a temperature, a current, or the like obtained in the diagnostic charge has been described in the embodiment, additionally, a battery DC resistance (mΩ) and a resistance degradation level SOHR (%) may be calculated. The battery DC resistance is calculated from, as an example, a voltage change amount after a predetermined period when a constant current load is applied in a state after the voltage is stabilized at a predetermined SOC.

The predetermined SOC is an SOC after the post-operation rest period, and calculated from the voltage change amount after a predetermined period when a charge load is applied in a charge period of the secondary battery. Formula 17 is an exemplary operation expression.

$$DCR_{Charge,5} = \Delta V_{Charge,5}/I_{Charge} \quad \text{(Formula 17)}$$

In Formula 17, a charge DC resistance (fifth second) $DCR_{Charge,5}$ is calculated from a voltage change amount $\Delta V_{Charge,5}$ five seconds after the charging start and a charge load $I_{Charge}$. The SOHR is calculated as a rate of the current battery DC resistance (resistance degradation level) with 100% of the initial battery DC resistance in the SOC at the start of charging. Since the DC resistance depends on the cell temperature and the SOC, the initial battery DC resistance is obtained based on a preliminarily prepared battery DC resistance Map (beginning) having the cell temperature and the SOC as parameters and the obtained current cell temperature and SOC.

In the battery excavator 1 according to the embodiment, the controller 300 includes the diagnostic charge recommendation determination unit 301 that determines whether to recommend the diagnostic charge or not based on the operation history of the secondary battery 201 output from the battery management unit 202, and the diagnostic charge execution determination unit 302 that determines whether to execute the diagnostic charge or not based on the state of the secondary battery 201 output from the battery management unit 202, the estimated charge period necessary for the diagnostic charge, and the site work plan that is a next work start time when the diagnostic charge is determined to be recommended. Accordingly, by limiting the execution of the diagnostic charge provided with the rest period to the case where the diagnostic charge is determined to be recommended, the number of times of the diagnostic charge having the long total charge period can be reduced. Moreover, in consideration of the site work plan, by limiting the execution of the diagnostic charge to the case where the total charge period for the diagnostic charge can be allowed, the risk of obstructing the site work plan can be reduced. Consequently, it can be avoided to obstruct the work plan of the battery excavator 1, and the operation efficiency of the battery excavator 1 can be improved.

Further, the battery management unit 202 calculates the charge rates SOC before and after charging based on the operation history of the secondary battery 201, and further calculates the full charge capacity Q of the secondary battery or the degradation level SOHQ of the secondary battery capacity based on the calculated charge rates SOC before and after charging and the charged electric charge amounts ΔQ of the secondary battery 201. Therefore, the full charge capacity or the SOHQ can be accurately calculated.

Second Embodiment

Next, the second embodiment of a battery excavator will be described. While the control processes illustrated in FIG. 4 are all automatically performed in the first embodiment, the second embodiment is configured to leave the final execution determination of the diagnostic charge or the normal charge to a worker (operator, maintenance service person, or the like) even when the diagnostic charge is determined to be executed. At this time, the execution of the diagnostic charge or the normal charge in the charge mode is finally determined by, for example, the operator by selecting the charge mode on a selection screen displayed by a monitor display device.

Figure 12:
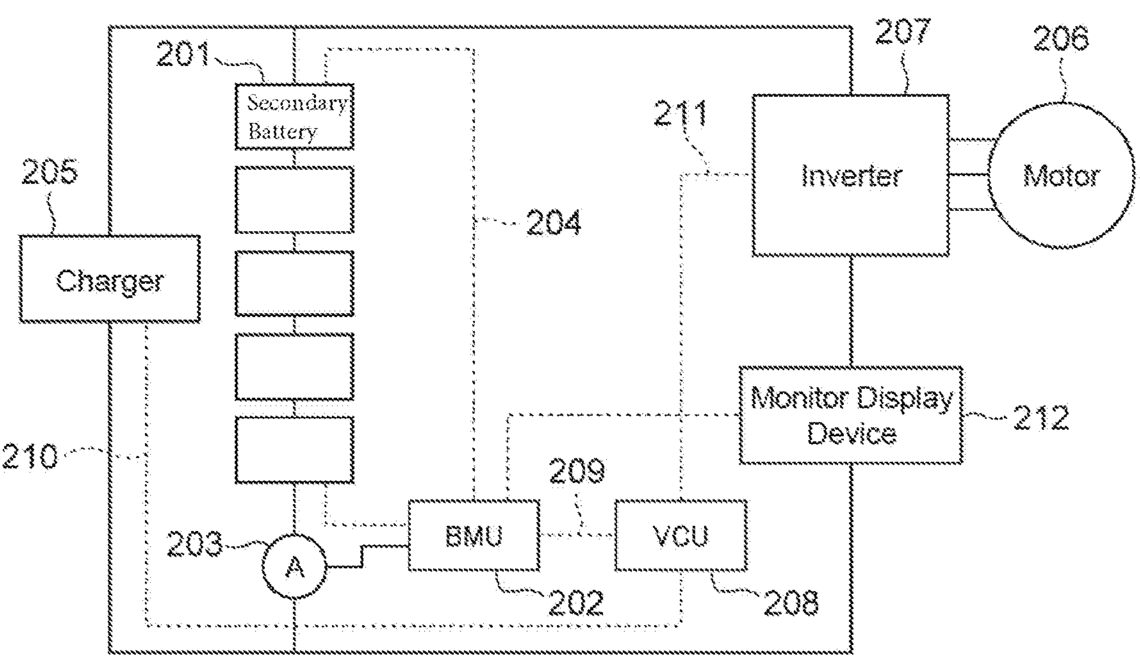
FIG. 12 is a block diagram illustrating a battery system of a battery excavator according to a second embodiment.

FIG. 12 is a block diagram illustrating a battery system of a battery excavator according to a second embodiment. As illustrated in FIG. 12, the battery system according to this embodiment is different from the battery system according to the first embodiment in that a monitor display device 212 is further included.

The monitor display device 212 displays a selection screen of the charge mode and the like generated by the vehicle control unit 208. The charge mode selection screen generated by the vehicle control unit 208 is generated based on the determination result of the diagnostic charge recommendation determination unit 301, the determination result of the diagnostic charge execution determination unit 302, and the calculation result of the battery management unit 202.

Figure 13:
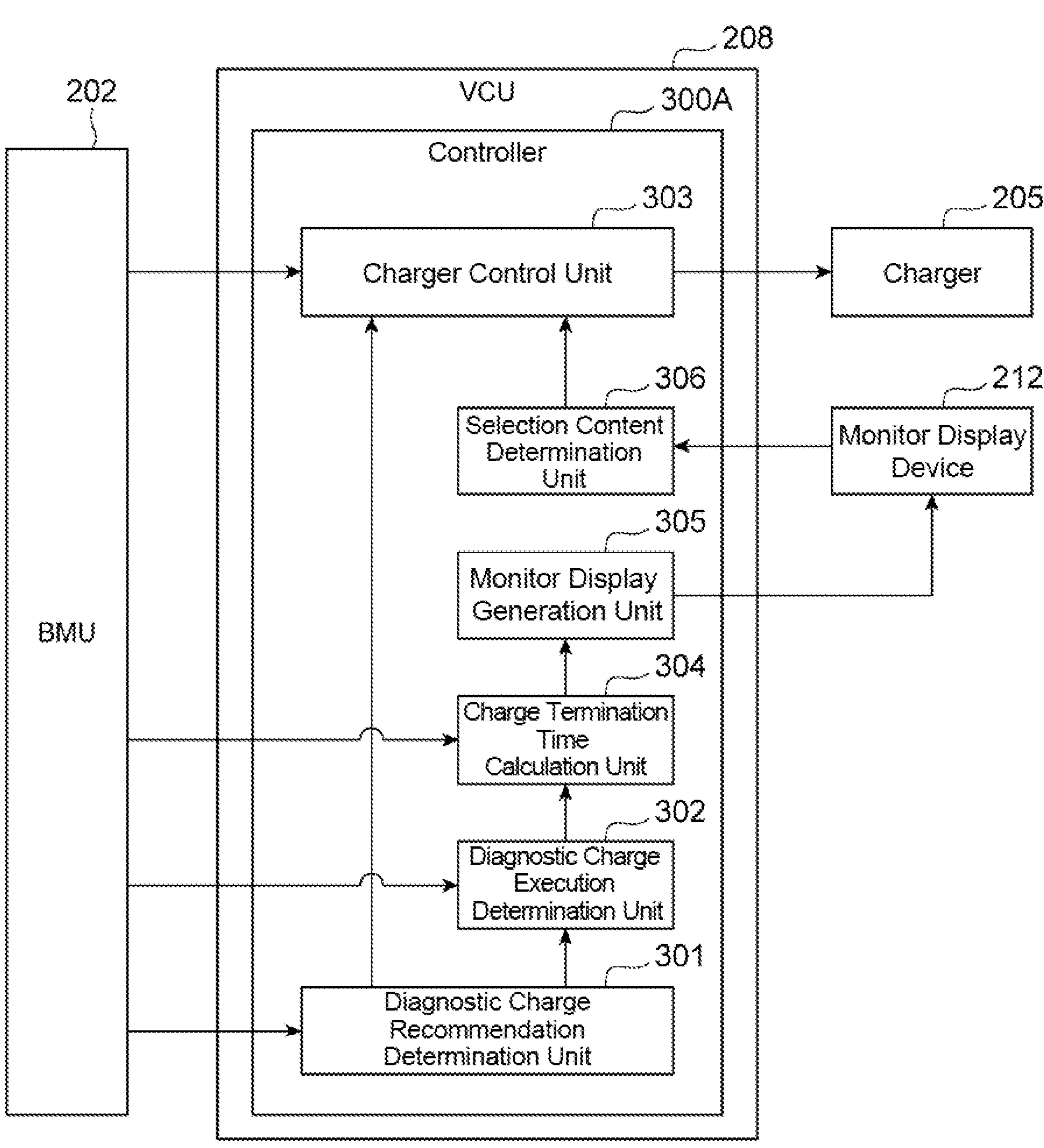
FIG. 13 is a function block diagram illustrating a controller disposed in a vehicle control unit of the second embodiment.

FIG. 13 is a function block diagram illustrating a controller disposed in a vehicle control unit of the second embodiment. A controller 300A of this embodiment further includes a charge termination time calculation unit 304, a monitor display generation unit 305, and a selection content determination unit 306 compared with the controller 300 of the first embodiment.

Figure 14:
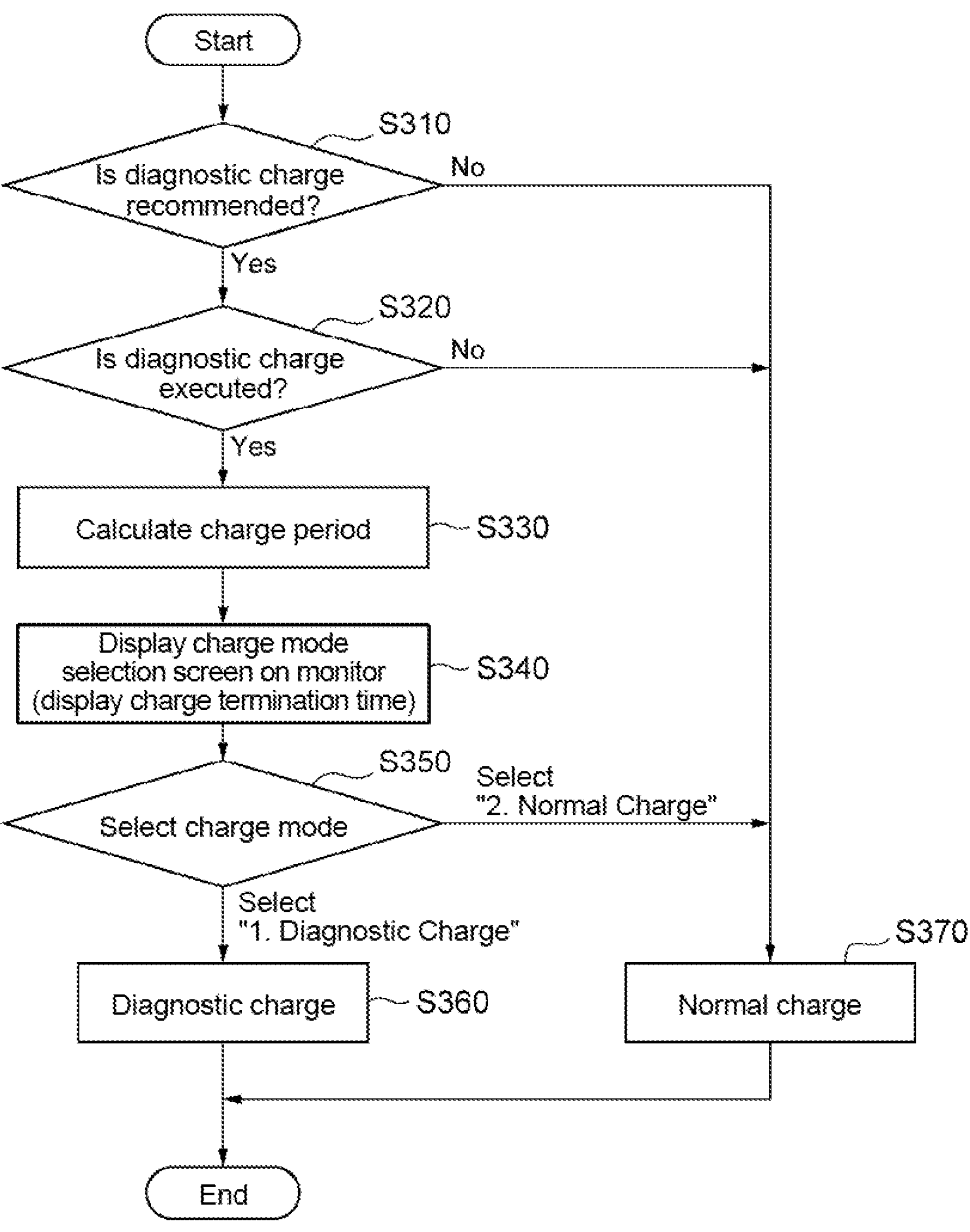
FIG. 14 is a flowchart illustrating a charge control for a secondary battery in the second embodiment.

FIG. 14 is a flowchart illustrating a charge control to a secondary battery in the second embodiment. The control process illustrated in FIG. 14 is started in a state where the charge operation of the battery excavator 1 is started, for example, a current cable is connected.

In Step S310, the diagnostic charge recommendation determination unit 301 determines whether to recommend the diagnostic charge or not based on the operation history of the secondary battery 201 output from the battery management unit 202. Specific determination method is the same as that described in the first embodiment. When it is determined to recommend the diagnostic charge, the control process proceeds to Step S320.

In Step S320, the diagnostic charge execution determination unit 302 determines whether to execute the diagnostic charge or not based on the state of the secondary battery 201 output from the battery management unit 202, the estimated charge period necessary for the diagnostic charge, and the site work plan that is a work start time. The specific determination method is the same as that described in the first embodiment. When the diagnostic charge is determined to be executable, the control process proceeds to Step S330.

In Step S330, the charge period is calculated. Here, the battery management unit 202 calculates each of the estimated charge periods necessary for the normal charge and the diagnostic charge based on Formula 15 and Formula 16 described above.

In Step S340 subsequent to Step S330, the charge mode selection screen is displayed on the monitor. The charge mode selection here means the selection of the "normal charge" or the "diagnostic charge." Specifically, first, the charge termination time calculation unit 304 calculates each of the charge termination times of the normal charge and the diagnostic charge based on the current time and the estimated charge periods necessary for the normal charge and the diagnostic charge calculated by the battery management unit 202. Next, the monitor display generation unit 305 generates a monitor screen for displaying the charge termination times of the normal charge and the diagnostic charge calculated by the charge termination time calculation unit 304, and causes the monitor display device 212 to display the monitor screen.

In Step S350 subsequent to Step S340, the charge mode is selected. Here, a worker such as an operator or a maintenance service person selects the charge mode displayed on the monitor display device 212. When the worker selects "1. Diagnostic Charge" (see FIG. 15) displayed on the monitor display device 212, the selection content determination unit 306 determines the selected content, and issues a command to the charger control unit 303. Accordingly, the diagnostic charge is performed (see Step S360).

Meanwhile, when it is determined not to recommend the diagnostic charge in Step S310, when it is determined not to execute the diagnostic charge in Step S320, or when the worker selects "2. Normal Charge" (see FIG. 15) in Step S340, the selection content determination unit 306 determines the selected content, and issues a command to the charger control unit 303. Accordingly, the normal charge is performed (see Step S370).

Figure 15:
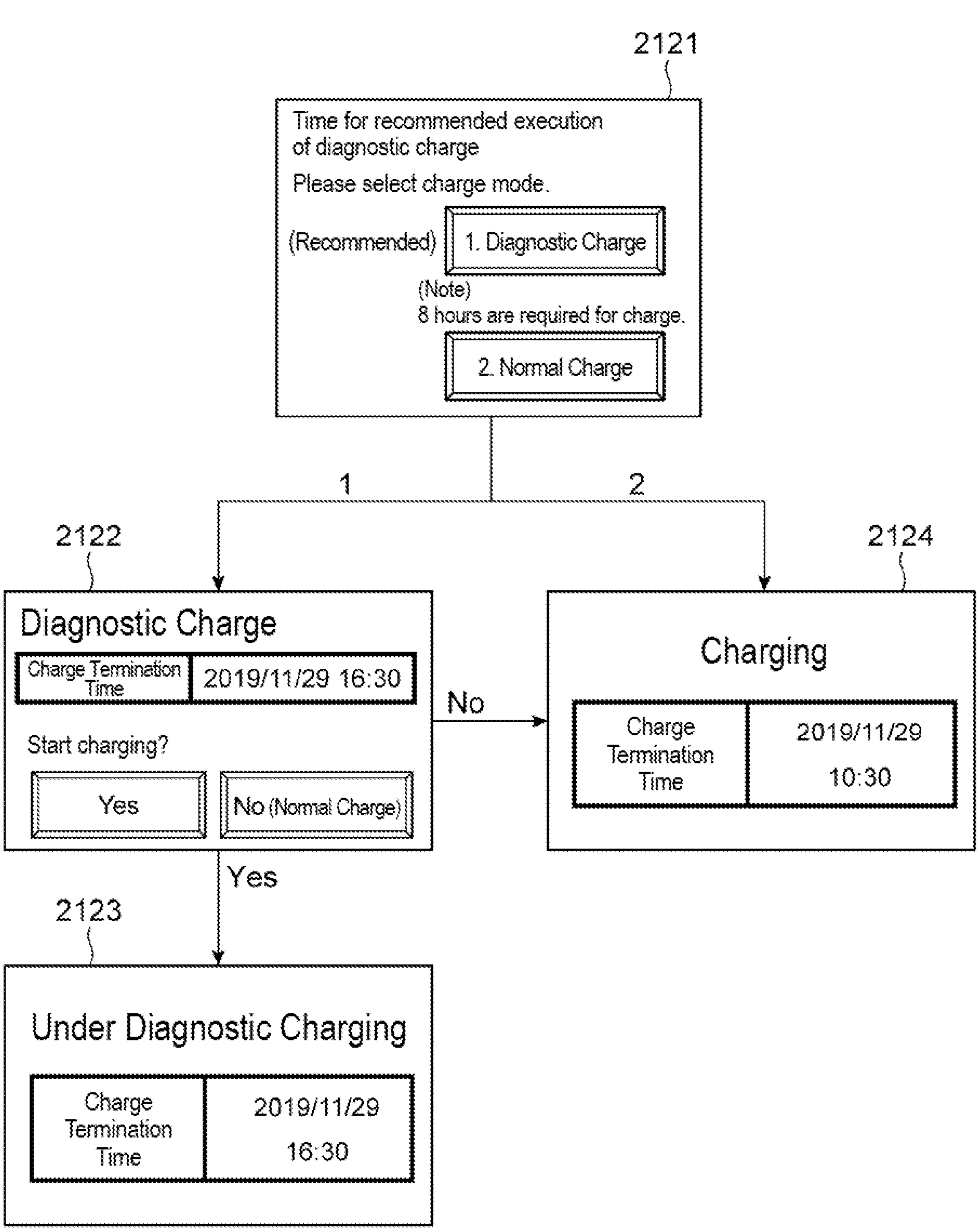
FIG. 15 is a drawing describing an example of display screen of a monitor display device and selection process.

FIG. 15 is a drawing describing an example of display screen of a monitor display device and selection process. As illustrated in FIG. 15, first, for example, by displaying "Time for recommended execution of diagnostic charge" on a display screen (selection screen) 2121 of the monitor display device 212 as a reminder to the worker, the charge mode of "1. Diagnostic Charge" or "2. Normal Charge" is displayed, and the worker selects the charge mode. The required estimated charge period or the like is displayed with "1. Diagnostic Charge" in addition to a notation of recommendation.

When the worker selects "1. Diagnostic Charge," the screen of the monitor display device 212 changes into a diagnostic charge execution confirmation screen 2122. At this time, a charge termination time of the diagnostic charge is displayed in the diagnostic charge execution confirmation screen 2122, and the worker selects whether to start charging or not based on the work plan. When charging start (that is, Yes) is selected, the diagnostic charge is performed, and the display screen of the monitor display device 212 changes into a diagnostic charge execution screen 2123.

Meanwhile, when the worker selects "2. Normal Charge" on the selection screen 2121, or when not start charging (that is, No) is selected on the diagnostic charge execution confirmation screen 2122, the normal charge is performed, and the display screen of the monitor display device 212 changes into a normal charge execution screen 2124.

With the battery excavator of the embodiment, the operational advantage similar to that of the first embodiment can be obtained. Additionally, since the battery excavator of the embodiment is configured to allow the worker to finally determine the final execution determination of the diagnostic charge or the normal charge even when the diagnostic charge is determined to be executed, the capability of dealing with the site situation or the like can be enhanced.

While it is described in the embodiment that the final execution determination of the diagnostic charge or the normal charge is left to the worker even when the diagnostic charge is determined to be executed, for example, when the worker desires to diagnose the state of the secondary battery 201, the diagnostic charge may be executed as necessary by issuing a command to the battery management unit 202 and the vehicle control unit 208 by an on-site operation or a remote operation via an external computer or the like even when the diagnostic charge is determined to be executed.

While the embodiments of the present invention have been described in detail above, the present invention is not limited to the above-described embodiments, and the various changes in design may be performed without departing from the spirits of the present invention described in the claims.

REFERENCE SIGNS LIST

1 Battery excavator (electric powered working machine)
201 Secondary battery
202 Battery management unit
203 Ammeter
204, 209, 210, 211 Communication line
205 Charger
206 Motor
207 Inverter
208 Vehicle control unit
212 Monitor display device
300, 300A Controller
301 Diagnostic charge recommendation determination unit
302 Diagnostic charge execution determination unit
303 Charger control unit
304 Charge termination time calculation unit
305 Monitor display generation unit
306 Selection content determination unit

601 Charge amount calculation unit
602 ΔSOC calculation unit
603 Battery capacity calculation unit
604 SOHQ calculation unit

The invention claimed is:

1. An electric powered working machine with a secondary battery, comprising:

a battery management unit that manages the secondary battery; and a controller that controls a normal charge without a rest period during charging or a diagnostic charge provided with a rest period during charging for the secondary battery, wherein the controller is configured to:

determine to recommend the diagnostic charge when a current full charge capacity of the secondary battery and a degradation level of the secondary battery capacity are deviated from calculation values of a full charge capacity of the secondary battery and the degradation level of the secondary battery capacity that are calculated in a previous diagnostic charge, and determine not to recommend the diagnostic charge when the current full charge capacity of the secondary battery and the degradation level of the secondary battery capacity are not deviated from the calculation values of the full charge capacity of the secondary battery and the degradation level of the secondary battery capacity that are calculated in the previous diagnostic charge;

determine whether to execute the diagnostic charge or not based on a state of the secondary battery output from the battery management unit, an estimated charge period necessary for the diagnostic charge, and a site work plan including a work start time, when determining that the diagnostic charge is recommended and control charge of the secondary battery;

execute the normal charge when determining that the diagnostic charge is not recommended;

execute the diagnostic charge when determining that the diagnostic charge is recommended and determining that the diagnostic charge is executed; and even when determining that the diagnostic charge is recommended, execute the normal charge when determining not to execute the diagnostic charge.

2. The electric powered working machine according to claim 1, wherein the diagnostic charge is a charge mode provided with respective preset rest periods before and after charging, and wherein the rest periods of the diagnostic charge are set based on a temperature and a polarization time constant of the secondary battery depending on a charge status.

3. The electric powered working machine according to claim 1, wherein the battery management unit calculates each of charge status before and after charging based on an operation history of the secondary battery in the diagnostic charge or the normal charge, and calculates each of the full charge capacity of the secondary battery or the degradation level of the secondary battery capacity based on the calculated charge status before and after charging and a charged electric charge amount of the secondary battery.

4. The electric powered working machine according to claim 1, wherein the controller determines to recommend the diagnostic charge when a difference between a current time and a date of starting use of the secondary battery or a difference between the current time and a date of performing a previous diagnostic charge becomes equal to or more than a preliminarily determined time period.

5. The electric powered working machine according to claim 1, wherein the controller determines to recommend the diagnostic charge when a difference between an initial value of the degradation level of the secondary battery capacity or the degradation level of the secondary battery capacity calculated in the previous diagnostic charge and a current degradation level of the secondary battery capacity calculated based on an operation history after the previous diagnostic charge using a degradation prediction function becomes equal to or more than a preliminarily determined threshold.

6. The electric powered working machine according to claim 1, wherein the controller determines to recommend the diagnostic charge when a difference between an average value of latest points in the degradation level of the secondary battery capacity in the normal charge and an initial value of the degradation level of the secondary battery capacity or the degradation level of the secondary battery capacity in the previous diagnostic charge becomes equal to or more than a preliminarily determined threshold.

7. The electric powered working machine according to claim 1, wherein the controller determines to recommend the diagnostic charge when a difference between a charge status range during operation and a charge status range during charging becomes equal to or less than a preliminarily determined threshold, the charge status range during operation is calculated based on an initial value of the secondary battery full charge capacity or the degradation level of the secondary battery capacity, or the secondary battery full charge capacity or the degradation level of the secondary battery in the previous diagnostic charge, and the charge status range during charging is calculated based on an operation history of the secondary battery in the normal charge.

8. The electric powered working machine according to claim 1, wherein the controller further comprises a monitor display device that displays a determination result of whether the diagnostic charge is recommended or not and a determination result of whether the diagnostic charge is executed, and displays a screen for selecting the normal charge or the diagnostic charge.

9. The electric powered working machine according to claim 1, wherein the controller determines to execute the diagnostic charge when a remaining charge available period calculated based on the current time and the site work plan is equal to or more than an estimated charge period necessary for the diagnostic charge and a change amount of the charge status before and after the diagnostic charge is equal to or more than a predetermined value.

10. The electric powered working machine according to claim 9, wherein in a case where the remaining charge available period is smaller than the estimated charge period necessary for the diagnostic charge, the controller determines to execute the diagnostic charge when the temperature of the secondary battery becomes higher than a target temperature to be set by a warm-up operation.

* * * * *